United States Patent
Sakata et al.

(10) Patent No.: US 9,881,997 B2
(45) Date of Patent: Jan. 30, 2018

(54) SEMICONDUCTOR DEVICE AND MANUFACTURING METHOD OF SEMICONDUCTOR DEVICE

(71) Applicant: FUJI ELECTRIC CO., LTD., Kawasaki-shi, Kanagawa (JP)

(72) Inventors: Toshiaki Sakata, Matsumoto (JP); Yasushi Niimura, Matsumoto (JP); Shunji Takenoiri, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/060,588

(22) Filed: Mar. 3, 2016

(65) Prior Publication Data

US 2016/0293692 A1    Oct. 6, 2016

(30) Foreign Application Priority Data

Apr. 2, 2015 (JP) .................................. 2015-076123
Nov. 5, 2015 (JP) .................................. 2015-217948

(51) Int. Cl.
*H01L 29/06* (2006.01)
*H01L 21/266* (2006.01)

(52) U.S. Cl.
CPC ........ *H01L 29/0634* (2013.01); *H01L 21/266* (2013.01)

(58) Field of Classification Search
CPC ........................... H01L 29/0634; H01L 21/266
USPC .................... 257/13, 493, 336, 330, 339, 48
See application file for complete search history.

(56) References Cited

U.S. PATENT DOCUMENTS

| 6,551,909 B1 | 4/2003 | Fujihira |
| 2002/0171093 A1 | 11/2002 | Onishi et al. |
| 2008/0290403 A1 | 11/2008 | Ono et al. |
| 2011/0279017 A1* | 11/2011 | Li ...................... C09K 11/0883 313/503 |
| 2014/0035002 A1 | 2/2014 | Cao et al. |
| 2014/0061644 A1* | 3/2014 | Cao ................. H01L 21/823487 257/48 |
| 2014/0117437 A1 | 5/2014 | Willmeroth et al. |

(Continued)

FOREIGN PATENT DOCUMENTS

| JP | 2000-040822 A | 2/2000 |
| JP | 2002-280555 A | 9/2002 |

(Continued)

*Primary Examiner* — Bo Fan
(74) *Attorney, Agent, or Firm* — Rabin & Berdo, P.C.

(57) ABSTRACT

A first parallel pn layer having a first n-type region and a first p-type region junctioned alternately and repeatedly is disposed in an element active portion. The first parallel pn layer has a striped planar layout. A second parallel pn layer having a second n-type region and a second p-type region junctioned alternately and repeatedly is disposed in a high voltage structure. The second parallel pn layer has a striped planar layout in a direction identical to that of the first parallel pn layer. An intermediate region having a third parallel pn layer and a fourth parallel pn layer of a lower impurity quantity than the first parallel pn layer is disposed between the first and second parallel pn layers, and formed by diffusing impurity implanting regions becoming the first and the second parallel pn layers formed separated from each other to a region in which no impurity is ion-implanted.

10 Claims, 23 Drawing Sheets

(56) References Cited

U.S. PATENT DOCUMENTS

| | | | |
|---|---|---|---|
| 2014/0312418 A1* | 10/2014 | Tamaki | H01L 24/05 257/339 |
| 2014/0319604 A1* | 10/2014 | Bhalla | H01L 29/0696 257/330 |
| 2015/0001668 A1* | 1/2015 | Kitagawa | H01L 27/0629 257/493 |
| 2015/0021686 A1* | 1/2015 | Shea | H01L 29/0634 257/336 |
| 2015/0069567 A1* | 3/2015 | Yedinak | H01L 29/66712 257/493 |
| 2016/0104768 A1 | 4/2016 | Willmeroth et al. | |

FOREIGN PATENT DOCUMENTS

| | | |
|---|---|---|
| JP | 2008-294214 A | 12/2008 |
| JP | 2010-056154 A | 3/2010 |
| JP | 2011-192824 A | 9/2011 |
| JP | 2012-160752 A | 8/2012 |
| WO | WO-2013/008543 A1 | 1/2013 |

\* cited by examiner

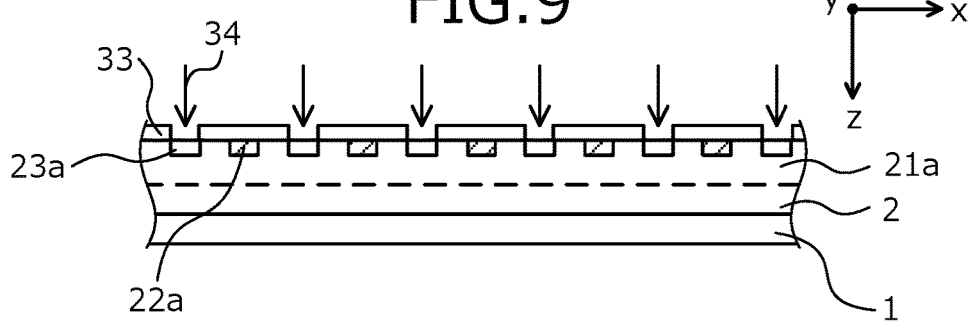
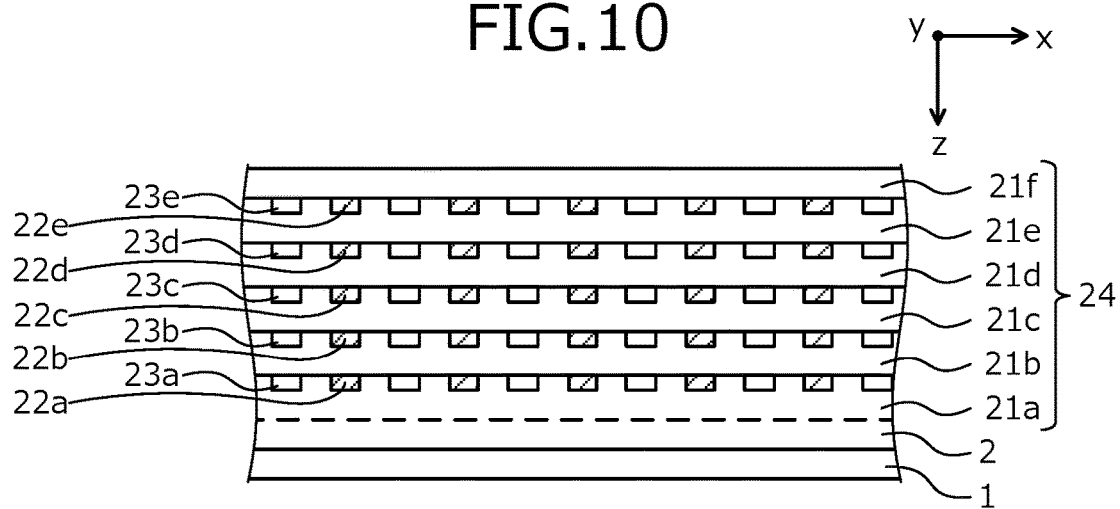
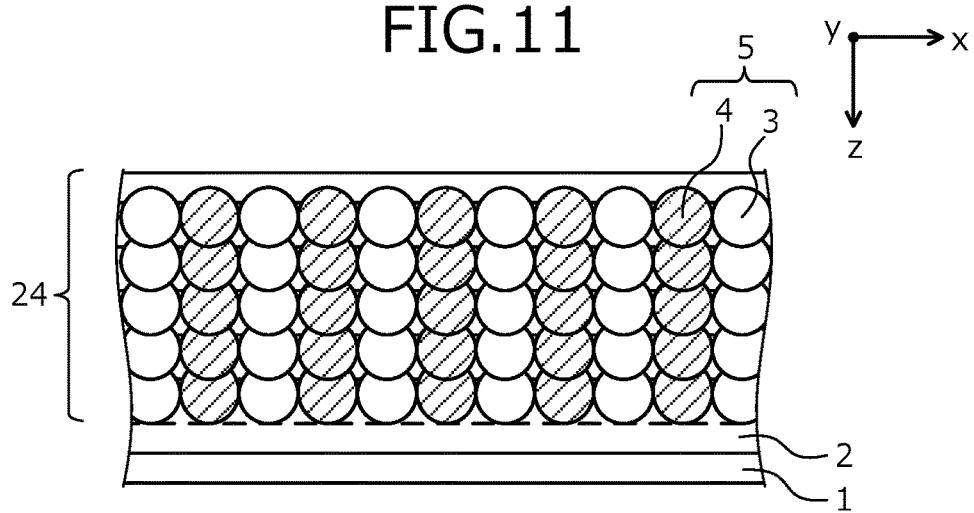

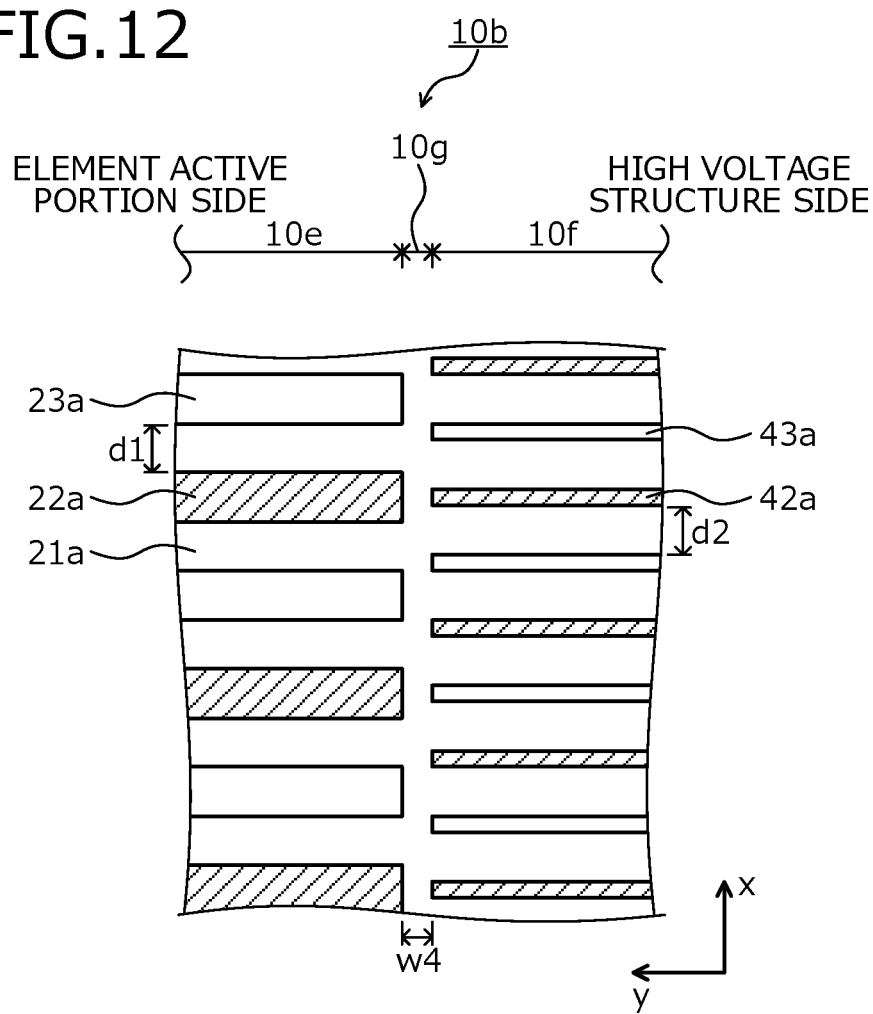

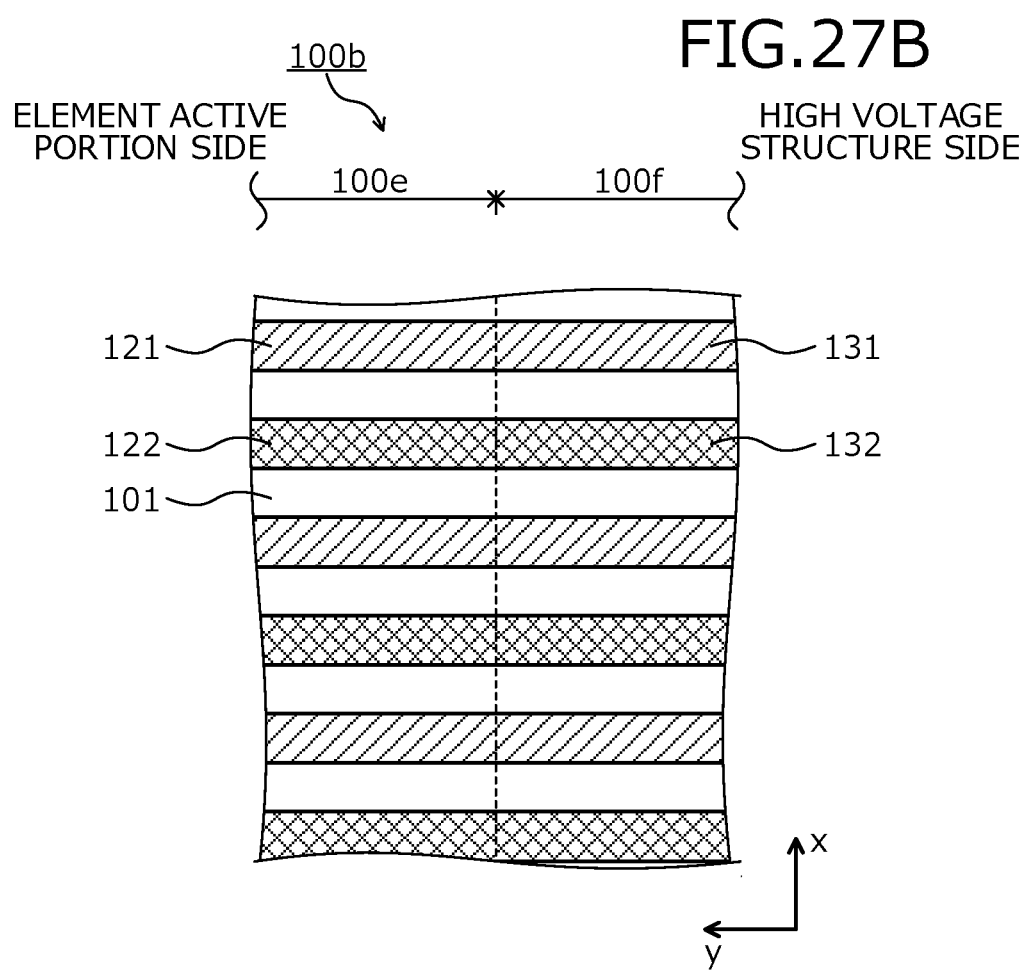

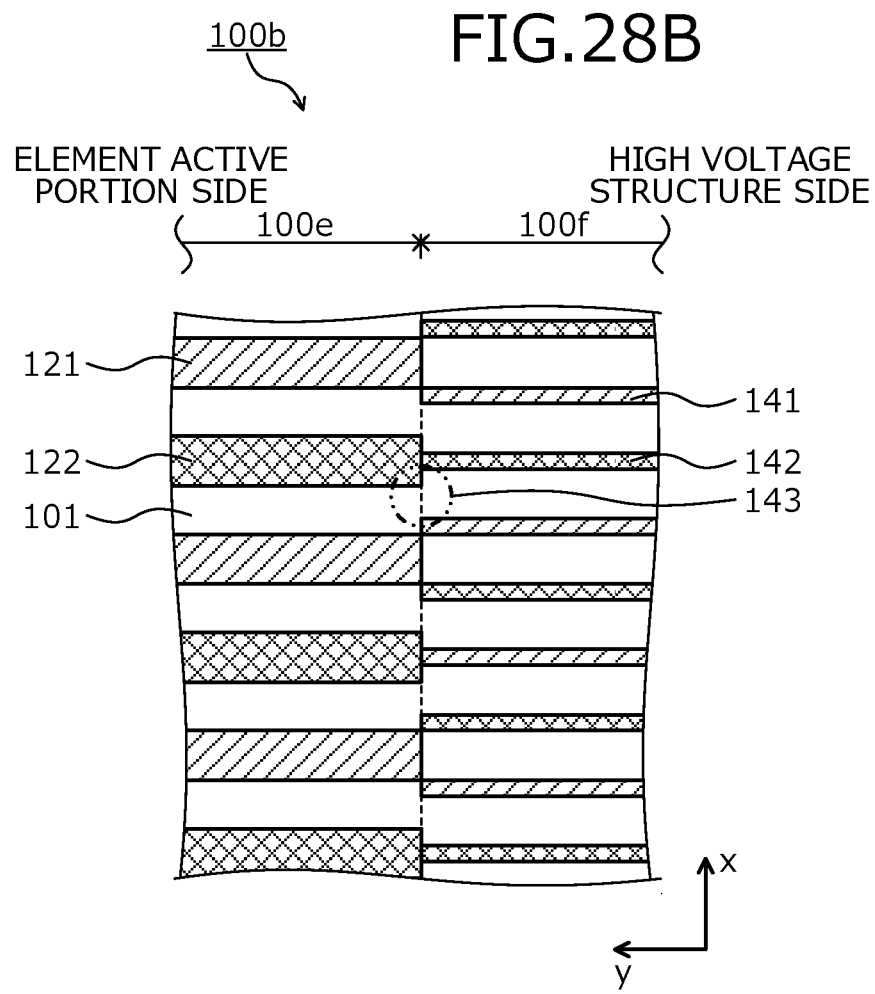

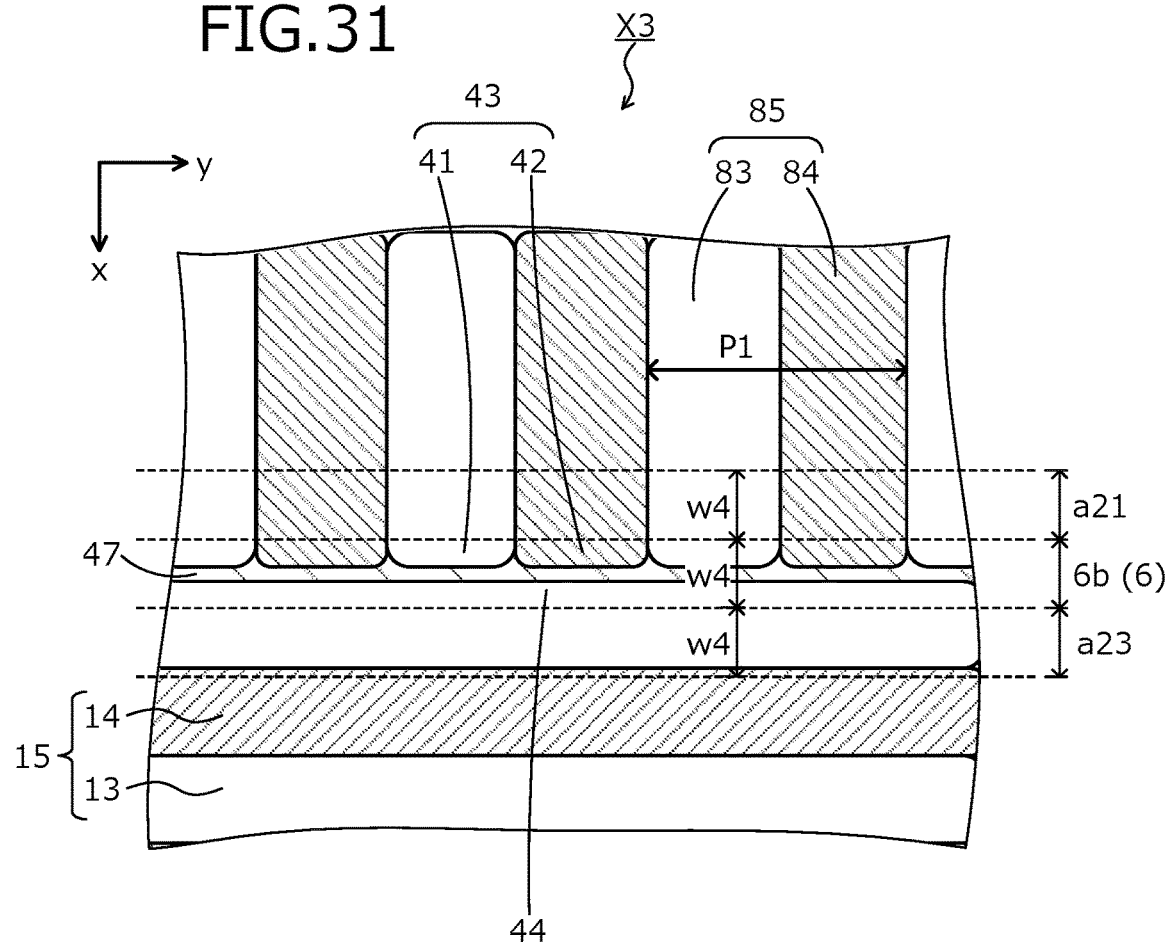

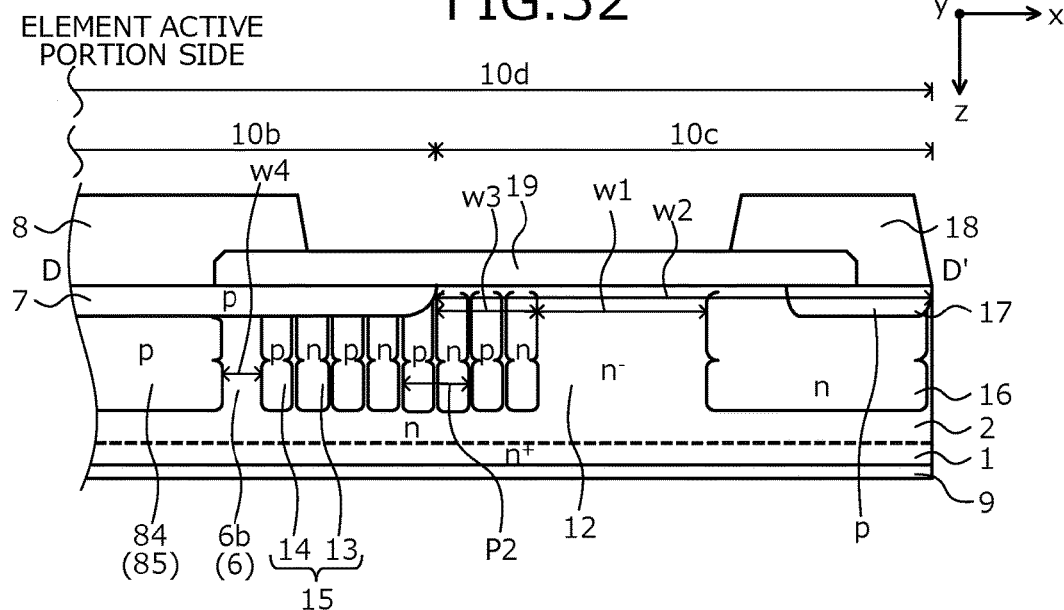
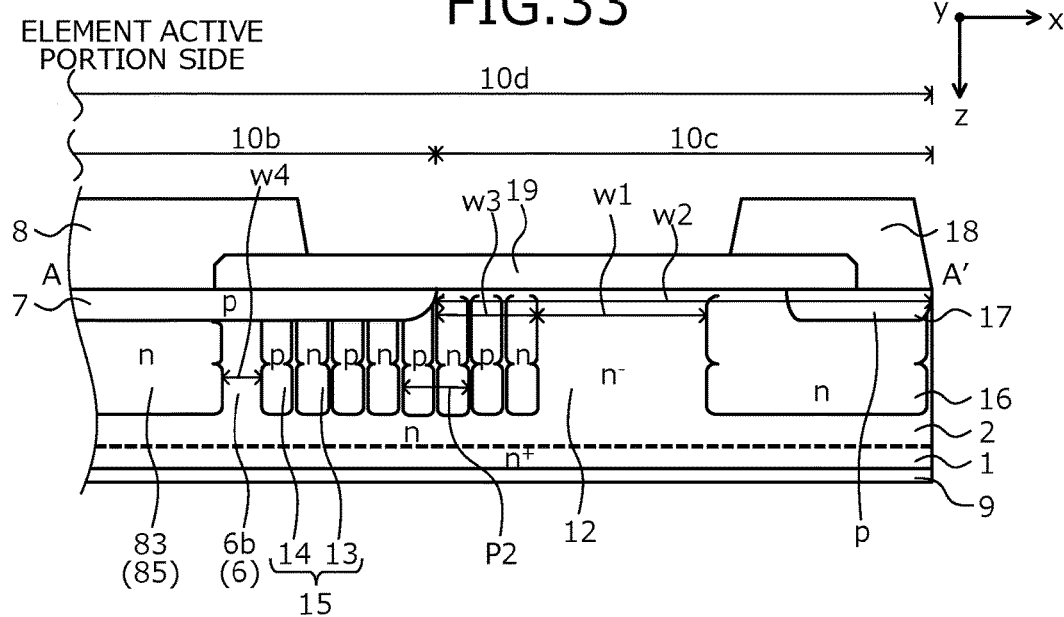

US 9,881,997 B2

SEMICONDUCTOR DEVICE AND MANUFACTURING METHOD OF SEMICONDUCTOR DEVICE

CROSS REFERENCE TO RELATED APPLICATIONS

This application is based upon and claims the benefit of priority of the prior Japanese Patent Application No. 2015-076123, filed on Apr. 2, 2015, and No. 2015-217948 filed on Nov. 5, 2015, the entire contents of which are incorporated herein by reference.

BACKGROUND OF THE INVENTION

1. Field of the Invention

The embodiments discussed herein are related to a semiconductor device and manufacturing method of the semiconductor device.

2. Description of the Related Art

Conventionally, a semiconductor device of a superjunction (SJ) structure (hereinafter, superjunction semiconductor device) is known that has a drift layer made as a parallel pn layer with an n-type region and a p-type region of increased impurity concentration alternately arranged in a direction parallel to a chip principal surface (horizontal direction). In the superjunction semiconductor device, in the on-state, current flows to the n-type region of the parallel pn layer and in the off-state, a depletion layer extends also from a pn junction between the n-type region and the p-type region of the parallel pn layer and the n-type region and the p-type region are depleted and bear a breakdown voltage. In the superjunction semiconductor device, since the impurity concentration of the drift layer can be increased, on-state resistance can be decreased while maintaining a high breakdown voltage.

With respect to such a superjunction semiconductor device, a device is proposed that has the parallel pn layer with the n-type region and the p-type region arranged in a planar layout of a stripe having a same width and extending from an element active portion to a high voltage structure (for example, refer to Japanese Laid-Open Patent Publication No. 2008-294214 (paragraph 0020, FIGS. 1 and 2)). In Japanese Laid-Open Patent Publication No. 2008-294214, the breakdown voltage of the high voltage structure is made higher than that of the element active portion by making the impurity concentration of the parallel pn layer in the high voltage structure lower than that of the parallel pn layer in the element active portion. The element active portion is a region in which current flows in the on-state. An element edge portion surrounds the element active portion. The high voltage structure is arranged in the element edge portion and is a region that relaxes electric field on the top surface side of the chip and holds the breakdown voltage.

As another superjunction semiconductor device, a device is proposed in which a repetitive pitch of the n-type region and the p-type region of the parallel pn layer is made narrower in the high voltage structure than in the element active portion (for example, refer to Japanese Laid-Open Patent Publication No. 2002-280555 (paragraph 0023, FIG. 6) and International Publication No. 2013/008543 (paragraph 0032, FIGS. 1 and 2)). In Japanese Laid-Open Patent Publication No. 2002-280555, the parallel pn layer having the n-type region and the p-type region arranged in the stripe-like planar layout is disposed in both the element active portion and the high voltage structure. In International Publication No. 2013/008543, the parallel pn layer having the n-type region and the p-type region arranged in the stripe-like planar layout is disposed in the element active portion and the parallel pn layer having the p-type region arranged in a matrix-like planar layout inside the n-type region is disposed in the high voltage structure.

As another superjunction semiconductor device, a device is proposed in which the n-type region and the p-type region of the parallel pn layer are arranged in the stripe-like planar layout and a width in a lateral direction orthogonal to the stripe (hereinafter referred to simply as width) of the n-type region and the p-type region of the parallel pn layer in the high voltage structure is partially changed (for example, refer to Japanese Laid-Open Patent Publication No. 2010-056154). As another superjunction semiconductor device, a device is proposed in which the n-type region and the p-type region of the parallel pn layer are arranged in the stripe-like planar layout and in the vicinity of the boundary with the high voltage structure, the width of the p-type region of the parallel pn layer in the element active portion is gradually narrowed outwardly (for example, refer to Japanese Laid-Open Patent Publication No. 2012-160752 (paragraph 0051, FIGS. 18 and 19)).

In Japanese Laid-Open Patent Publication No. 2002-280555, International Publication No. 2013/008543, and Japanese Laid-Open Patent Publication Nos. 2010-056154 and 2012-160752, by changing the repetitive pitch of the n-type region and the p-type region of the parallel pn layer or the width of the p-type region of the parallel pn layer, between the element active portion and the high voltage structure, the impurity concentration of the parallel pn layer in the high voltage structure is made lower than that of the parallel pn layer in the element active portion. For this reason, in the same manner as in Japanese Laid-Open Patent Publication No. 2008-294214, the breakdown voltage of the high voltage structure is made higher than that of the element active portion.

As to a parallel pn layer forming method, a method is proposed of ion-implanting the n-type impurity over the entire surface, selectively ion-implanting the p-type impurity using a resist mask, and then diffusing the impurity by heat treatment, each time a non-doped layer is stacked on another by the epitaxial growth (for example, refer to Japanese Laid-Open Patent Publication No. 2011-192824 (paragraph 0025, FIGS. 1 to 4)). In Japanese Laid-Open Patent Publication No. 2011-192824, with consideration of a subsequent thermal diffusion process, the opening width of the resist mask used for the p-type impurity ion-implantation is set on the order of ¼ of the remaining width and accordingly, the implanting quantity of the p-type impurity is set on the order of 4 times the implanting quantity of the n-type impurity, thereby making the total impurity quantities of the n-type region and the p-type region of the parallel pn layer equal.

As to another parallel pn layer forming method, a method is proposed of selectively ion-implanting the n-type impurity and the p-type impurity, using different resist masks, and then diffusing the impurity by the heat treatment, each time an n-type high resistance layer is stacked upon another by the epitaxial growth (for example, refer to Japanese Laid-Open Patent Publication No. 2000-040822 (paragraph Nos. 0032 to 0035, FIG. 4)). In Japanese Laid-Open Patent Publication No. 2000-040822, the n-type impurity implanting region that becomes the n-type region of the parallel pn layer and the p-type impurity implanting region that becomes the p-type region of the parallel pn layer are selectively formed so as to oppose each other in the lateral direction and be thermally diffused. This makes it possible to cause both the n-type region and the p-type region to have high impurity concentration and suppress variation in the impurity concentration in the vicinity of the pn junction with the laterally adjacent region.

As a result of an intensive research by inventors, however, it has been found out that in the case of forming the parallel pn layer in the element active portion and the high voltage structure by selectively ion-implanting the n-type impurity and the p-type impurity as in Japanese Laid-Open Patent Publication No. 2000-040822, there arises the following problem. FIGS. 27A, 27B, 28A, and 28B are top views of the planar layout of the parallel pn layer of a conventional superjunction semiconductor device. FIGS. 27A and 28A depict the planar layout at the time of completion of the parallel pn layer. FIGS. 27A and 28A depict a quarter of the conventional superjunction semiconductor device. FIGS. 27B and 28B depict the state during formation of the parallel pn layer in a boundary region 100b between an element active portion 100a and a high voltage structure 100c. An element edge portion 100d is formed by the boundary region 100b and the high voltage structure 100c. In FIGS. 27A, 27B, 28A, and 28B, the lateral direction in which the stripe of the parallel pn layer extends is given as y and the lateral direction orthogonal to the stripe is given as x. Reference numeral 101 denotes an n⁻ type semiconductor layer to be epitaxially grown for the formation of the parallel pn layer.

As depicted in FIGS. 27A and 28A, in the conventional superjunction semiconductor device, a parallel pn layer (hereinafter, first parallel pn layer) 104 of the element active portion 100a and a parallel pn layer (hereinafter, second parallel pn layer) 114 of the high voltage structure 100c both extend to the boundary region 100b between the element active portion 100a and the high voltage structure 100c and contact each other. As depicted in FIGS. 27B and 28B, at the time of formation of the first and the second parallel pn layers 104 and 114, an n-type impurity implanting region 121 that becomes a first n-type region 102 of the first parallel pn layer 104 and a p-type impurity implanting region 122 that becomes a first p-type region 103 are each formed so as to extend to a first region 100e on the inner side (on the element active portion 100a side) of the boundary region 100b. N-type impurity implanting regions 131 and 141 that become second n-type regions 112 and 115 of the second parallel pn layer 114 and p-type impurity implanting regions 132 and 142 that become second p-type regions 113 and 116 are each formed so as to extend to a second region 100f on the outer side (on the high voltage structure 100c side) of the boundary region 100b. Each of these impurity implanting regions extends to the boundary (vertical dotted lines) of the first region 100e and the second region 100f.

As depicted in FIGS. 27B and 28B, when the repetitive pitch P11 of the first n-type region 102 and the first p-type region 103 and the repetitive pitch P12 of the second n-type region 112 and the second p-type region 113 are made equivalent (P11=P12), the same conductive type regions of the first and the second parallel pn layers 104 and 114 are all in the state of contacting each other. Namely, the n-type impurity implanting regions 121 and 131 that become the first and the second n-type regions 102 and 112, and the p-type impurity implanting regions 122 and 132 that become the first and the second p-type regions 103 and 113, are respectively arranged in the planar layout of stripe continuing from the element active portion 100a to the high voltage structure 100c. For this reason, while the charge balance of the first and the second parallel pn layers 104 and 114 is not broken at the boundary region 100b, no breakdown voltage difference is caused between the element active portion and the high voltage structure since the first and the second parallel pn layers 104 and 114 have the same average impurity concentration. Therefore, a problem arises in that the electric field easily concentrates locally on the high voltage structure 100c whereby the breakdown voltage of the entire element is determined by the breakdown voltage of the high voltage structure 100c.

On the other hand, as depicted in FIGS. 28A and 28B, when the repetitive pitch P12 of the second n-type region 115 and the second p-type region 116 is made narrower than the repetitive pitch P11 of the first n-type region 102 and the first p-type region 103 (P11>P12), the cycle at which the same conductive type regions of the first and the second parallel pn layers 104 and 114 contact each other is determined on the basis of the ratio of the repetitive pitches P11 and P12. Namely, in the boundary region 100b, with respect to the n-type impurity implanting regions 121 and 141 that become the first and the second n-type regions 102 and 115, and the p-type impurity implanting regions 122 and 142 that become the first and the second p-type regions 103 and 116, the same type impurity implanting regions contact each other at some locations and do not contact each other at other locations. For this reason, in the boundary region 100b, the n-type impurity concentration and the p-type impurity concentration are increased. For example, around a location 143 where the p-type impurity implanting regions 122 and 142 contact each other and become continuous, since the distances to adjacent n-type impurity implanting regions 121 and 141 differ, the p-type impurity concentration is higher than the n-type impurity concentration. Therefore, it is difficult to secure the charge balance at the boundary between the first parallel pn layer 104 and the second parallel pn layer 114 and a problem arises in that the breakdown voltage of the boundary region 100b decreases partially. With respect to this problem, although the partial decreasing of the breakdown voltage can be suppressed by making the average impurity concentration of the first and the second parallel pn layers 104 and 114 relatively low, the breakdown voltage of the entire element decreases.

SUMMARY OF THE INVENTION

To solve the problems above associated with conventional techniques and achieve an object, according to one aspect of the present disclosure, a semiconductor device includes a surface element structure disposed on a first principal surface side; a low resistance layer disposed on a second principal surface side; a first parallel pn layer disposed between the surface element structure and the low resistance layer and having a first first-conductive-type region and a first second-conductive-type region alternately arranged; a second parallel pn layer disposed so as to surround the first parallel pn layer and having a second first-conductive-type region and a second second-conductive-type region alternately arranged with a repetitive pitch that is narrower than that of the first first-conductive-type region and the first second-conductive-type region; and an intermediate region disposed between the first parallel pn layer and the second parallel pn layer so as to contact the first parallel pn layer and the second parallel pn layer. The intermediate region includes a third second-conductive-type region contacting the first second-conductive-type region of the first parallel pn layer and having an average impurity concentration that is lower than that of the first second-conductive-type region; and a fourth second-conductive-type region contacting the second second-conductive-type region of the second parallel pn layer and having an average impurity concentration that is lower than that of the second second-conductive-type region.

Further, in the semiconductor device, the intermediate region includes a third first-conductive-type region contacting the first first-conductive-type region of the first parallel pn layer and having an average impurity concentration that is lower than that of the first first-conductive-type region; and a fourth first-conductive-type region contacting the second first-conductive-type region of the second parallel pn layer and having an average impurity concentration that is lower than that of the second first-conductive-type region.

The semiconductor device further includes a third parallel pn layer arranged in the intermediate region and having the third first-conductive-type region and the third second-conductive-type region arranged alternately.

The semiconductor device further includes a fourth parallel pn layer arranged in the intermediate region and having the fourth first-conductive-type region and the fourth second-conductive-type region arranged alternately.

Further, in the semiconductor device, the first first-conductive-type region and the first second-conductive-type region are arranged in a stripe-like planar layout; the second first-conductive-type region and the second second-conductive-type region are arranged in a stripe-like planar layout in a direction identical to that of the first first-conductive-type region and the first second-conductive-type region; and the third second-conductive-type region and the fourth second-conductive-type region are arranged in a stripe-like planar layout in a direction identical to that of the first second-conductive-type region and the second second-conductive-type region.

In, the semiconductor device, among sets of the third second-conductive-type region and the fourth second-conductive-type region opposing each other, at least one set of the third second-conductive-type region and the fourth second-conductive-type region contact each other.

In the semiconductor device, the first first-conductive-type region and the first second-conductive-type region are arranged in a stripe-like planar layout; the second first-conductive-type region and the second second-conductive-type region are arranged a stripe-like planar layout in a direction orthogonal to that of the first first-conductive-type region and the first second-conductive-type region; the third second-conductive-type region is arranged in a stripe-like planar layout in a direction identical to that of the first second-conductive-type region; and the fourth second-conductive-type region is arranged in a stripe-like planar layout in a direction identical that of the second second-conductive-type region.

The semiconductor device further includes an element active portion in which the surface element structure and the first parallel pn layer are arranged and in which current flows in an on-state; an element edge portion surrounding the element active portion, in which the second parallel pn layer is arranged; a termination region disposed between the first principal surface and the low resistance layer, on the side opposite to the element active portion side of the element edge portion; a fifth first-conductive-type region disposed between the second parallel pn layer and the termination region, and having an average impurity concentration that is lower than that of the second first-conductive-type region; and a conductive layer electrically connected to the termination region.

Further, to solve the problems above associated with conventional techniques and achieve an object, according to another aspect of the present disclosure, a manufacturing method of a semiconductor device includes repeatedly performing depositing a first-conductive-type semiconductor layer and, forming a first first-conductive-type impurity implanting region and a first second-conductive-type impurity implanting region so as to be alternately arranged and forming a second first-conductive-type impurity implanting region and a second second-conductive-type impurity implanting region so as to be alternately arranged with a repetitive pitch that is narrower than that of the first first-conductive-type impurity implanting region and the first second-conductive-type impurity implanting region at a position farther outward by a predetermined width than the first first-conductive-type impurity implanting region and the first second-conductive-type impurity implanting region, on a surface layer of the first-conductive-type semiconductor layer; and heat treating and, forming a first parallel pn layer with a first first-conductive-type region and a first second-conductive-type region alternately arranged by diffusing the first first-conductive-type impurity implanting region and the first second-conductive-type impurity implanting region and forming a second parallel pn layer with a second first-conductive-type region and a second second-conductive-type region alternately arranged by diffusing the second first-conductive-type impurity implanting region and the second second-conductive-type impurity implanting region, through heat treatment. The heat treating includes forming an intermediate region having a third first-conductive-type region of an average impurity concentration that is lower than that of the first first-conductive-type region, a third second-conductive-type region of an average impurity concentration that is lower than that of the first second-conductive-type region, a fourth first-conductive-type region of an average impurity concentration that is lower than that of the second first-conductive-type region, and a fourth second-conductive-type region with the average impurity concentration lower than that of the second second-conductive-type region, by diffusing the first first-conductive-type impurity implanting region, the first second-conductive-type impurity implanting region, the second first-conductive-type impurity implanting region, and the second second-conductive-type impurity implanting region, between the first parallel pn layer and the second parallel pn layer.

Further, in the manufacturing method of the semiconductor device, the heat treating includes the forming of the intermediate region having a third parallel pn layer in which the third first-conductive-type region and the third second-conductive-type region are alternately arranged and a fourth parallel pn layer in which the fourth first-conductive-type region and the fourth second-conductive-type region are alternately arranged.

In the manufacturing method of the semiconductor device, the forming of the first first-conductive-type impurity implanting region and the first second-conductive-type impurity implanting region and the forming of the second first-conductive-type impurity implanting region and the second second-conductive-type impurity implanting region comprise forming the first first-conductive-type impurity implanting region and the first second-conductive-type impurity implanting region in a striped-like planar layout and forming the second first-conductive-type impurity implanting region and the second second-conductive-type impurity implanting region in a striped-like planar layout in a direction identical to that of the first first-conductive-type impurity implanting region and the first second-conductive-type impurity implanting region.

In the manufacturing method of the semiconductor device, the forming of the first first-conductive-type impurity implanting region and the first second-conductive-type impurity implanting region and the forming of the second first-conductive-type impurity implanting region and the second second-conductive-type impurity implanting region comprise forming the first first-conductive-type impurity implanting region and the first second-conductive-type impurity implanting region in a striped-like planar layout and forming the second first-conductive-type impurity implanting region and the second second-conductive-type impurity implanting region in a striped-like planar layout in a direction orthogonal to that of the first first-conductive-type impurity implanting region and the first second-conductive-type impurity implanting region.

Further, to solve the problems above associated with conventional techniques and achieve an object, according to another aspect of the present disclosure, a manufacturing method of a semiconductor device includes repeatedly performing depositing a first-conductive-type semiconductor layer and, forming a first second-conductive-type impurity implanting region so as to be alternately arranged and forming a second second-conductive-type impurity implanting region so as to be alternately arranged with a repetitive pitch that is narrower than that of the first second-conductive-type impurity implanting region at a position farther outward by a predetermined width than the first second-conductive-type impurity implanting region, on a surface layer of the first-conductive-type semiconductor layer; and heat treating and, forming a first parallel pn layer having a first second-conductive-type region and the first-conductive-type semiconductor layer alternately arranged by diffusing the first second-conductive-type impurity implanting region and forming a second parallel pn layer having a second second-conductive-type region and the first-conductive-type semiconductor layer alternately arranged by diffusing the second second-conductive-type impurity implanting region. The heat treating includes forming an intermediate region having a third second-conductive-type region of an average impurity concentration that is lower than that of the first second-conductive-type region and a fourth second-conductive-type region of an average impurity concentration that is lower than that of the second second-conductive-type region, by diffusing the first second-conductive-type impurity implanting region and the second second-conductive-type impurity implanting region, between the first parallel pn layer and the second parallel pn layer.

Further, in the manufacturing method of the semiconductor device, the forming of the first second-conductive-type impurity implanting region and the forming of the second second-conductive-type impurity implanting region include forming the first second-conductive-type impurity implanting region in a stripe-like planar layout and forming the second second-conductive-type impurity implanting region in a stripe-like planar layout in a direction identical to that of the first second-conductive-type impurity implanting region.

In the manufacturing method of the semiconductor device, the forming of the first second-conductive-type impurity implanting region and the forming of the second second-conductive-type impurity implanting region include forming the first second-conductive-type impurity implanting region in a stripe-like planar layout and forming the second second-conductive-type impurity implanting region in a stripe-like planar layout in a direction orthogonal to that of the first second-conductive-type impurity implanting region.

In the manufacturing method of the semiconductor device, the predetermined width is a half or less a thickness of the first-conductive-type semiconductor layer deposited by one execution of the depositing the first-conductive-type semiconductor.

The manufacturing method of the semiconductor device further includes forming the first parallel pn layer and the second parallel pn layer on a low resistance layer of a resistance that is lower than that of the first-conductive-type semiconductor layer; and forming a surface element structure on the first parallel pn layer, on a side opposite a low resistance layer side.

The manufacturing method of the semiconductor device further includes forming the first parallel pn layer in an element active portion in which current flows during an on-state; and forming the second parallel pn layer in an element edge portion surrounding the element active portion.

The other objects, features, and advantages of the present invention are specifically set forth in or will become apparent from the following detailed description of the invention when read in conjunction with the accompanying drawings.

BRIEF DESCRIPTION OF THE DRAWINGS

FIGS. 6, 7, 8, 9, 10, and 11 are cross-sectional views of states during manufacturing of the semiconductor device according to the first embodiment;

FIGS. 12 and 13 are top views of the semiconductor device according to the first embodiment during manufacturing;

FIGS. 27A, 27B, 28A, and 28B are top views of a planar layout of a parallel pn layer of a conventional superjunction semiconductor device;

FIG. 31 is an enlarged top view of X3 portion of FIG. 29;

FIG. 32 is a cross-sectional view along cutline D-D' in FIG. 29; and

FIG. 33 is a cross-sectional view along cutline E-E' in FIG. 29.

DETAILED DESCRIPTION OF THE PREFERRED EMBODIMENTS

Figure 1:
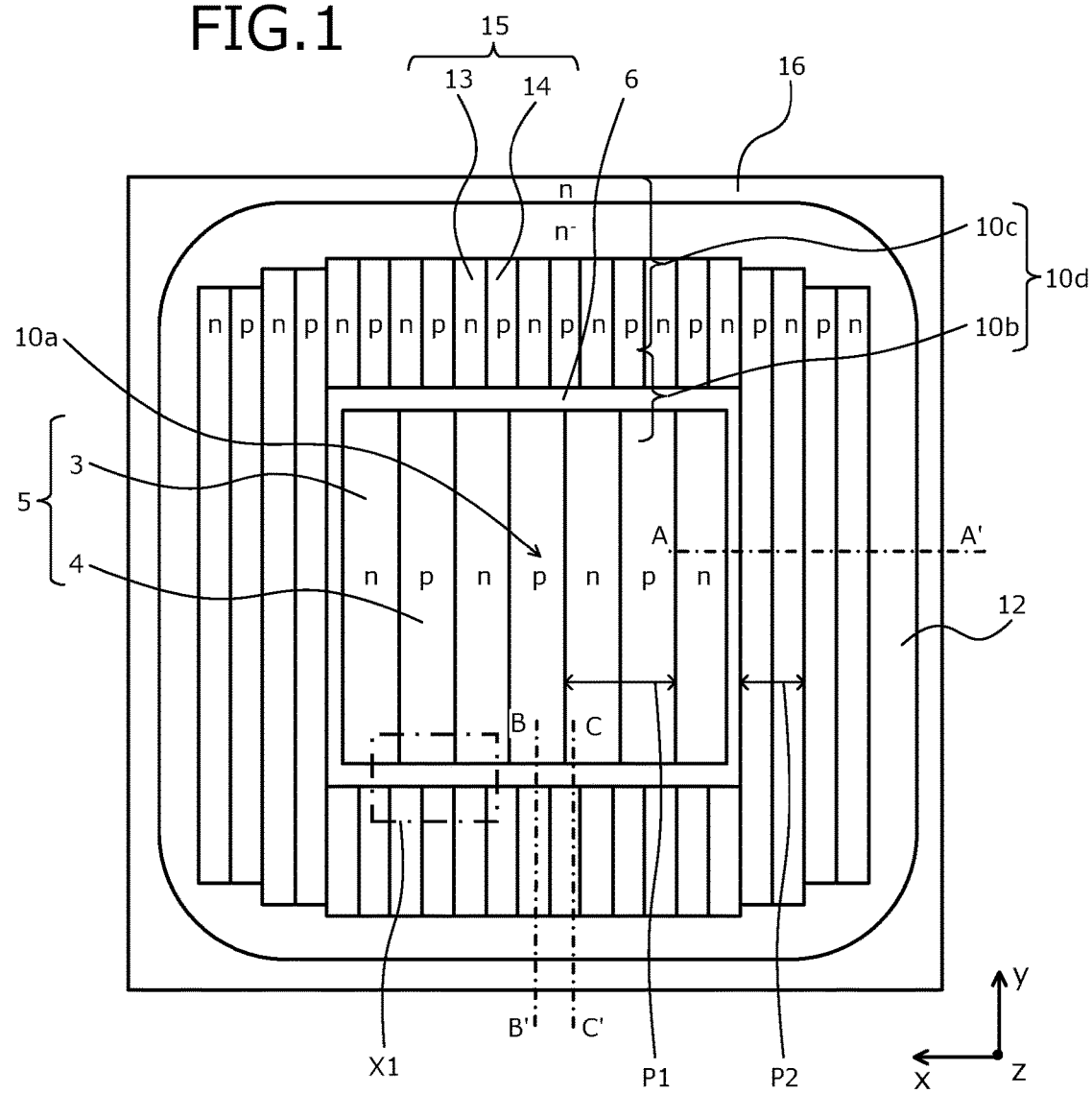
FIG. 1 is a top view of a planar layout of a semiconductor device according to a first embodiment.

Preferred embodiments of a semiconductor device and a manufacturing method of the semiconductor device will be described in detail with reference to the accompanying drawings. In the present specification and the accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not repeatedly be described.

First Embodiment

Figure 2:
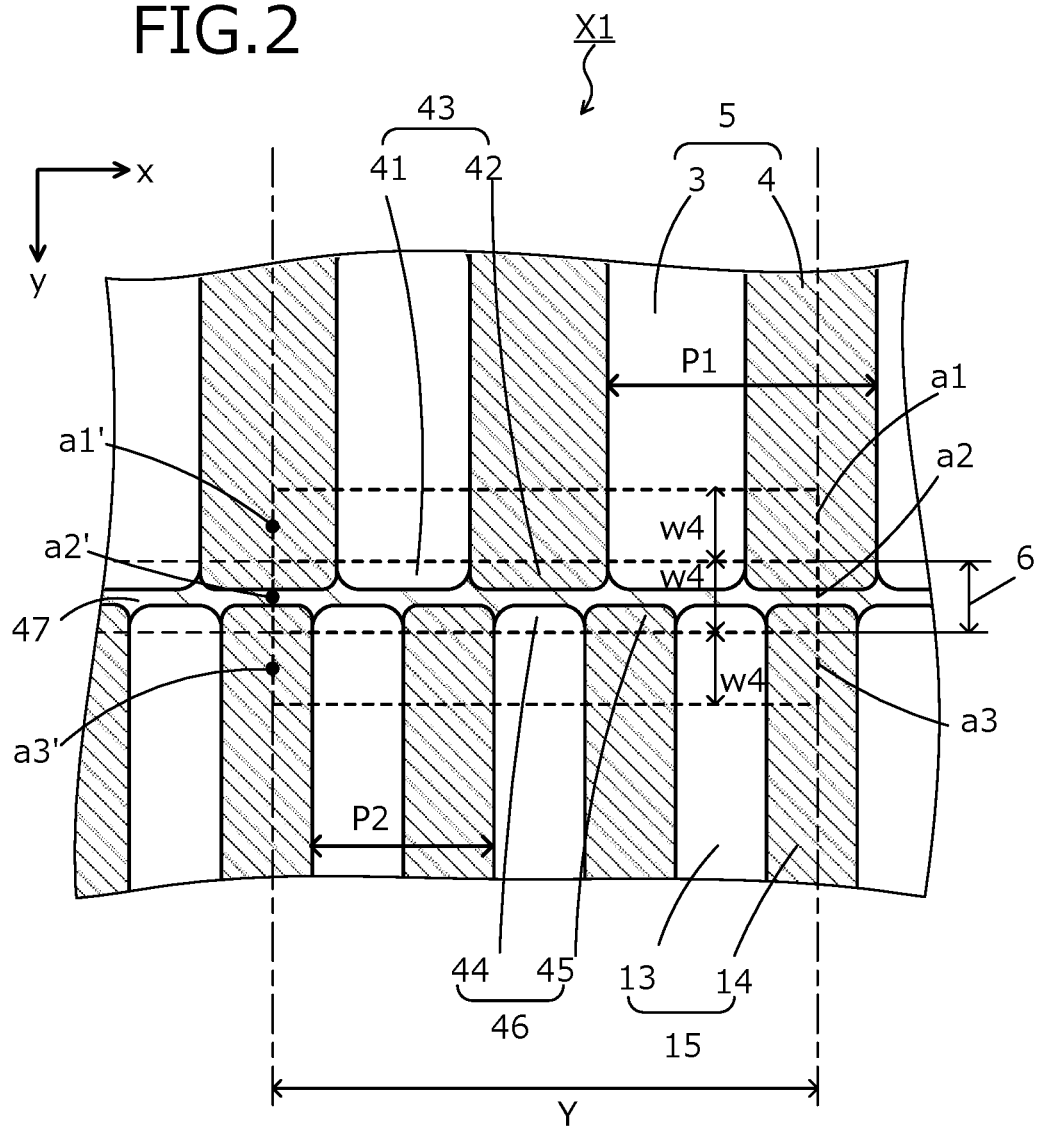
FIG. 2 is an enlarged top view of X1 portion of FIG. 1.
Figure 3:
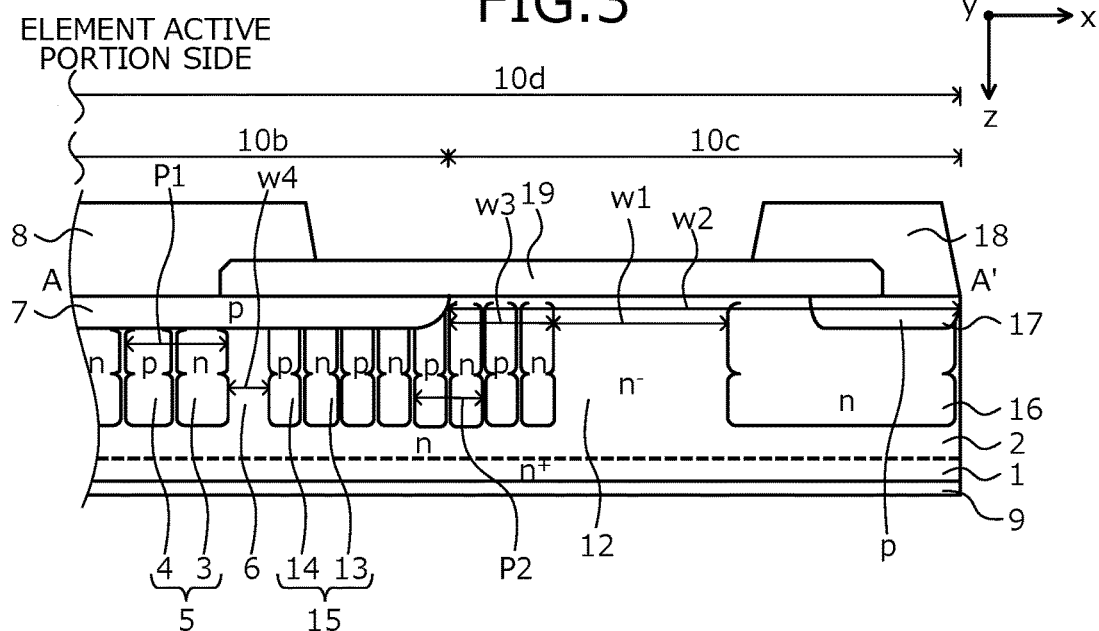
FIG. 3 is a cross-sectional view along cutline A-A' in FIG. 1.
Figure 4:
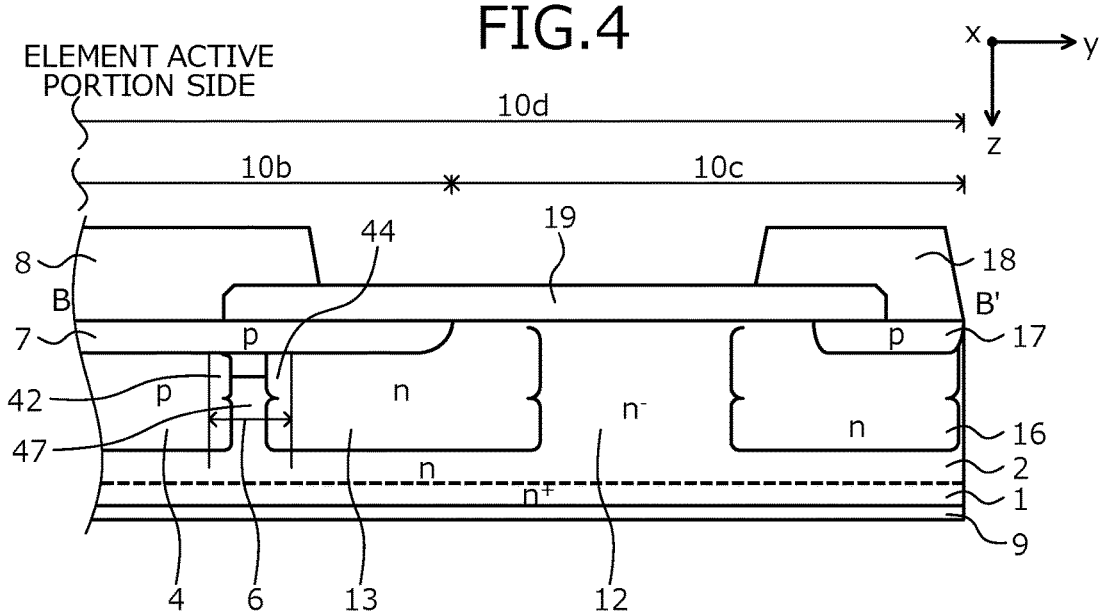
FIG. 4 is a cross-sectional view along cutline B-B' in FIG. 1.
Figure 5:
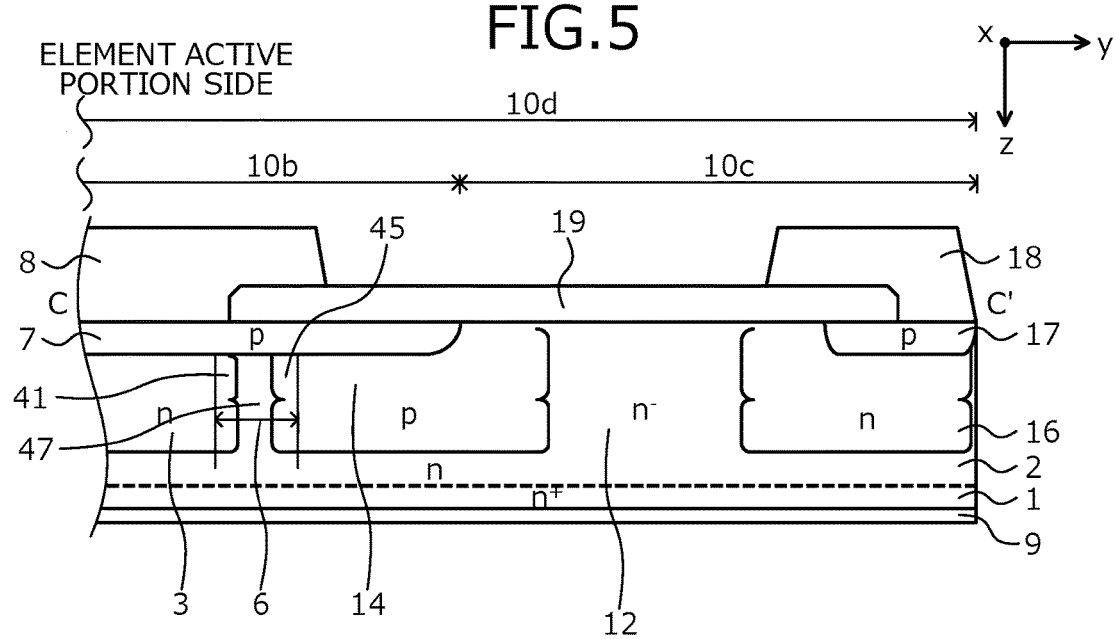
FIG. 5 is a cross-sectional view along cutline C-C' in FIG. 1.

A structure of the semiconductor device according to a first embodiment will be described taking as an example, an n-channel metal oxide semiconductor field effect transistor (MOSFET) having a superjunction structure. FIG. 1 is a top view of a planar layout of the semiconductor device according to the first embodiment. FIG. 2 is an enlarged top view of X1 portion of FIG. 1. FIG. 3 is a cross-sectional view along cutline A-A' in FIG. 1. FIG. 4 is a cross-sectional view along cutline B-B' in FIG. 1. FIG. 5 is a cross-sectional view along cutline C-C' in FIG. 1.

FIG. 1 depicts the shape of an element active portion 10a and an element edge portion 10d at a plane crossing first and second parallel pn layers 5 and 15, e.g., a plane at a depth ½ of that of the first parallel pn layer 5 of the element active portion 10a. The element active portion 10a is a region in which electric current flows in the on-state. The element edge portion 10d surrounds the element active portion 10a. In FIG. 1, to clarify a difference between the repetitive pitch P1 of a first n-type region (first first-conductive-type region) 3 and a first p-type region (first second-conductive-type region) 4 and the repetitive pitch P2 of a second n-type region (second first-conductive-type region) 13 and a second p-type region (second second-conductive-type region) 14, a fewer number of these regions are depicted than in FIG. 3.

As depicted in FIGS. 1 to 5, the semiconductor device according to the first embodiment has the element active portion 10a and the element edge portion 10d surrounding the element active portion 10a. On a first principal surface (chip surface) side of the element active portion 10a, a MOS (insulation gate composed of metal-oxide film-semiconductor) gate structure, not depicted, is disposed as an element surface structure. On a second principal surface (chip back surface) side of the element active portion 10a, an $n^+$ type drain layer (low resistance layer) 1 is disposed and an n-type buffer layer 2 is disposed at the position deeper from the second principal surface (chip back surface) than the $n^+$ type drain layer 1. On the second principal surface of the element active portion 10a, a drain electrode 9 in contact with the $n^+$ type drain layer 1 is disposed. The n-type buffer layer 2, the $n^+$ type drain layer 1, and drain electrode 9 are disposed from the element active portion 10a to the element edge portion 10d.

In the element active portion 10a, a first parallel pn layer 5 is disposed between the MOS gate structure and the n-type buffer layer 2. The first parallel pn layer 5 is formed by having the first n-type region 3 and the first p-type region 4 junctioned alternately and repeatedly in a direction parallel to the first principal surface (lateral direction). The planar layout of the first n-type region 3 and the first p-type region 4 is stripe-like. The outermost side (chip end side) of the repetition of the first n-type region 3 and the first p-type region 4 of the first parallel pn layer 5 is, for example, the first n-type region 3 and this outermost first n-type region 3 faces, for example, the second p-type region 14 of the second parallel pn layer 15 in the direction orthogonal to the stripe of the first parallel pn layer 5, with an intermediate region 6 to be described later therebetween. The first parallel pn layer 5 is disposed from the element active portion 10a to a boundary region 10b between the element active portion 10a and a high voltage structure 10c, in the direction in which the stripe of the first parallel pn layer 5 extends and in the direction orthogonal to the stripe.

The element edge portion 10d is formed by the boundary region 10b and the high voltage structure 10c. The element edge portion 10d is, for example, a region on the outer side of an outer end of a gate electrode of the MOS gate structure arranged outermost or, in the case of an $n^+$ type source region being arranged on the outer side of this gate electrode, a region on the outer side of the outer end of this $n^+$ type source region. The high voltage structure 10c is a region that relaxes electric field on the chip surface side and holds the breakdown voltage, and surrounds the element active portion 10a, with the boundary region 10b therebetween. The high voltage structure 10c is, for example, a region on the outer side of the outer end of a p-type base region 7 arranged outermost. In the high voltage structure 10c, the second parallel pn layer 15 is disposed on the n-type buffer layer 2. The second parallel pn layer 15 is formed by the second type region 13 and the second p-type region 14 junctioned alternately and repeatedly in the lateral direction.

The planar layout of the second n-type region 13 and the second p-type region 14 is stripe-like. The direction of the stripe of the second parallel pn layer 15 is the same as that of the stripe of the first parallel pn layer 5. Hereinafter, the lateral direction in which the stripe of the first and the second parallel pn layers 5 and 15 extends is given as a first direction y and the lateral direction orthogonal to the stripe (i.e., lateral direction orthogonal to first direction y) is given as a second direction x. The repetitive pitch P2 of the second n-type region 13 and the second p-type region 14 is narrower than the repetitive pitch P1 of the first n-type region 3 and the first p-type region 4. Accordingly, the average impurity concentration of the second n-type region 13 and the second p-type region 14 is lower than the average impurity concentration of the first n-type region 3 and the first p-type region 4, respectively. Since the second n-type region 13 and the second p-type region 14 are formed concurrently with the first n-type region 3 and the first p-type region 4, respectively, the narrow pitch makes the average impurity concentration low, causes a depletion layer to be easily extended in the direction of the outer periphery in the second parallel pn layer 15, and enables a high initial breakdown voltage to be achieved. Until depleted, the second p-type region 14 performs a function similar to that of a guard ring. Since this relaxes the electric field of the second n-type region 13, a high breakdown voltage of the high voltage structure 10c is easily achieved.

The second parallel pn layer 15 is disposed from the high voltage structure 10c to the boundary region 10b in a direction in which the stripe of the second parallel pn layer 15 extends and in a direction orthogonal to the stripe. The second parallel pn layer 15 surrounds the first parallel pn layer 5, with the intermediate region 6 therebetween, and further contacts the first parallel pn layer 5 by way of the intermediate region 6. Namely, both the first parallel pn layer 5 and the second parallel pn layer 15 are in contact with the intermediate region 6 and become a continuous region by way of the intermediate region 6. Of the second parallel pn layer 15, a portion arranged in the high voltage structure 10c may be disposed to have a thickness not reaching the first principal surface from the n-type buffer layer 2. Namely, in ion implantation and heat treatment to be described later for formation of the second parallel pn layer 15, the impurity ion-implanted into an epitaxial substrate is not required to be diffused to the first principal surface. In this case, in the high voltage structure 10c, the layer between the second parallel pn layer 15 and the first principal surface becomes the n⁻ type semiconductor layer epitaxially grown at the time of formation of the second parallel pn layer 15.

In the intermediate region 6 between the first and the second parallel pn layers 5 and 15, a third parallel pn layer 43 and a fourth parallel pn layer 46 are disposed by diffusing the impurity implanting regions, which respectively become the first and the second parallel pn layers 5 and 15, to be formed separately from each other by first and second ion implantations (described later) to a region in which no impurity is ion-implanted (third region to be described later) between the impurity implanting regions. For example, an inner side (chip center side) part of the intermediate region 6 has the third parallel pn layer 43 having a third n-type region (third first-conductive-type region) 41 and a third p-type region (third second-conductive-type region) 42, alternately arranged with the repetitive pitch about equal to the repetitive pitch P1 of the first n-type region 3 and the first p-type region 4 and having the impurity concentration decreasing toward the outer side. An outer side part of the intermediate region 6 has the fourth parallel pn layer 46 having a fourth n-type region (fourth first-conductive-type region) 44 and a fourth p-type region (fourth second-conductive-type region) 45, alternately arranged with the repetitive pitch about equal to the repetitive pitch P2 of the second n-type region 13 and the second p-type region 14 and having the impurity concentration decreasing toward the inner side. Namely, the intermediate region 6 is formed by the third n-type region 41 having an average impurity concentration that is lower than that of the first n-type region 3, the fourth n-type region 44 having an average impurity concentration that is lower than that of the second n-type region 13, the third p-type region 42 having an average impurity concentration that is lower than that of the first p-type region 4, and the fourth p-type region 45 having an average impurity concentration that is lower than that of the second p-type region 14.

The p-type impurity quantity and the n-type impurity quantity of a region a1 of the first parallel pn layer 5 and a region a3 of the second parallel pn layer 15, having a same width w4 as that of an intermediate region a2 in section Y between the positions where the centers of the first p-type region 4 and the second p-type region 14 oppose each other, satisfy Ca2<(Ca1+Ca3)/2 with respect to the intermediate region a2 in section Y. Ca1 to Ca3 represent the impurity quantity of the regions a1 to a3, respectively. The centers of the first p-type region 4 and the second p-type region 14 opposing each other means that the center in the second direction x of the first p-type region 4 and the center in the second direction x of the second p-type region 14 are located on a same straight line in the first direction y. For this reason, in the off-state, the intermediate region 6 is a region that is more easily depleted than the first parallel pn layer 5. Further, at the position where the centers of the first p-type region 4 and the second p-type region 14 oppose each other, the impurity concentration at the midpoint a2' of the intermediate region a2 in section Y is lower than the impurity concentration at the midpoint a1' of the region a1 of the first parallel pn layer and the impurity concentration at the midpoint a3' of the region a3 of the second parallel pn layer.

The third parallel pn layer 43 and the fourth parallel pn layer 46 arranged in the intermediate region 6 oppose each other. Between the third parallel pn layer 43 and the fourth parallel pn layer 46, there is a transition region 47 to which the impurity of each impurity implanting region of the first and the second parallel pn layers 5 and 15 having different repetitive pitches is diffused. In the third parallel pn layer 43 and the fourth parallel pn layer 46, the impurities between the impurity implanting regions that become the first and the second parallel pn layers 5 and 15 may diffuse and contact each other so as to overlap each other.

In the high voltage structure 10c, on the outer side of the second parallel pn layer 15, an n⁻ type region (fifth first-conductive-type region) 12 is disposed on the n⁻ type buffer layer 2. The n⁻ type region 12 is disposed having a thickness reaching the first principal surface from the n-type buffer region 2. The n⁻ type region 12 surrounds the second parallel pn layer 15 and has a function of suppressing the expansion of the depletion layer extending on the outer side of the second parallel pn layer 15 in the off-state. The average impurity concentration of the n⁻ type region 12 is lower than that of the second n-type region 13. Width w1 of the n– type region 12 is preferably, for example, on the order of ⅟₂₀ or greater and ⅓ or less of width w2 of the high voltage structure 10c. The reason is that, by making width w3 of such part of the second parallel pn layer 15 that is arranged in the high voltage structure 10c ⅔ or greater of width w2 of the high voltage structure 10c, the depletion of the second parallel pn layer 15 becomes comparatively easy and accordingly, a predetermined breakdown voltage is easy to secure.

In a termination region of the high voltage structure 10c, an n-type channel stopper region 16 is disposed on the n-type buffer layer 2. The n-type channel stopper region 16 is disposed having a thickness reaching the first principal surface from the n-type buffer layer 2. In place of the n-type channel stopper region 16, a p-type channel stopper region may be disposed. On the first principal surface side of the n-type channel stopper region 16, a p-type outermost peripheral region 17 is disposed. A channel stopper electrode 18 is connected to the p-type outermost peripheral region 17 and is electrically insulated from a source electrode 8 of the MOS gate structure by an interlayer insulation film 19 covering the first principal surface in the element edge portion 10d. The channel stopper electrode 18 extends over the interlayer insulation film 19 and protrudes on the inner side of the p-type outermost peripheral region 17. The channel stopper electrode 18 need not protrude on the inner side of the n-type channel stopper region 16.

Without particular limitation hereto, for example, when the semiconductor device according to the first embodiment is a vertical MOSFET with a rated breakdown voltage of 600V, the measurement and the impurity concentration of each portion may take the following values. The thickness of the drift region (thickness of the first parallel pn layer 5) is 35 μm and the width of the first n-type region 3 and the first p-type region 4 is 6.0 μm (repetitive pitch P1 is 12.0 μm). Peak impurity concentration in the width direction of the first n-type region 3 and the first p-type region 4 to be arranged on the surface of an n⁻ type semiconductor layer 21c corresponding to ½ the depth of the drift region (epitaxial layer 24 to be described later (see FIG. 10)) is $4.0 \times 10^{15}/cm^3$. The width of the second n-type region 13 and the second p-type region 14 is 4.0 µm (repetitive pitch P2 is 8.0 µm). The peak impurity concentration in the width direction of the second n-type region 13 and the second p-type region 14 to be arranged on the surface of the n⁻ type semiconductor layer 21c corresponding to ½ the depth of the drift region (epitaxial layer 24 to be described later) is $2.0 \times 10^{15}/cm^3$. Width w4 of the intermediate region 6 is 2 µm. The peak impurity concentration in the width direction of the n⁻ type region 12 to be arranged on the surface of the n⁻ type semiconductor layer 21c corresponding to ½ the depth of the drift region (epitaxial layer 24 to be described later) is preferably $1.0 \times 10^{15}/cm^3$ or less. Width w1 of the n⁻ type region 12 is 8 µm. Width w2 of the high voltage structure 10c is 150 µm. While such part of the second parallel pn layer 15 that is arranged in the high voltage structure 10c is illustrated in a simplified manner in FIGS. 3 to 5 (likewise in FIGS. 17 to 19, FIGS. 32 and 33), width w3 of such part of the second parallel pn layer 15 that is arranged in the high voltage structure 10c is 110 µm. When the rated breakdown voltage is 300V, the peak impurity concentration in the width direction of the n⁻ type region 12 is preferably $1.0 \times 10^{16}/cm^3$ or less.

In this first embodiment, while the configuration has been depicted disposing the first parallel pn layer 5 between the MOS gate structure and the n-type buffer layer 2 in the element active portion 10a and disposing the second parallel pn layer 15 on the n-type buffer 2 in the high voltage structure 10c, configuration may be such that the first parallel pn layer 5 is disposed between the MOS gate structure and the n⁺ type drain layer 1 and the second parallel pn layer 15 is disposed on the n+ type drain layer 1.

Figure 13:
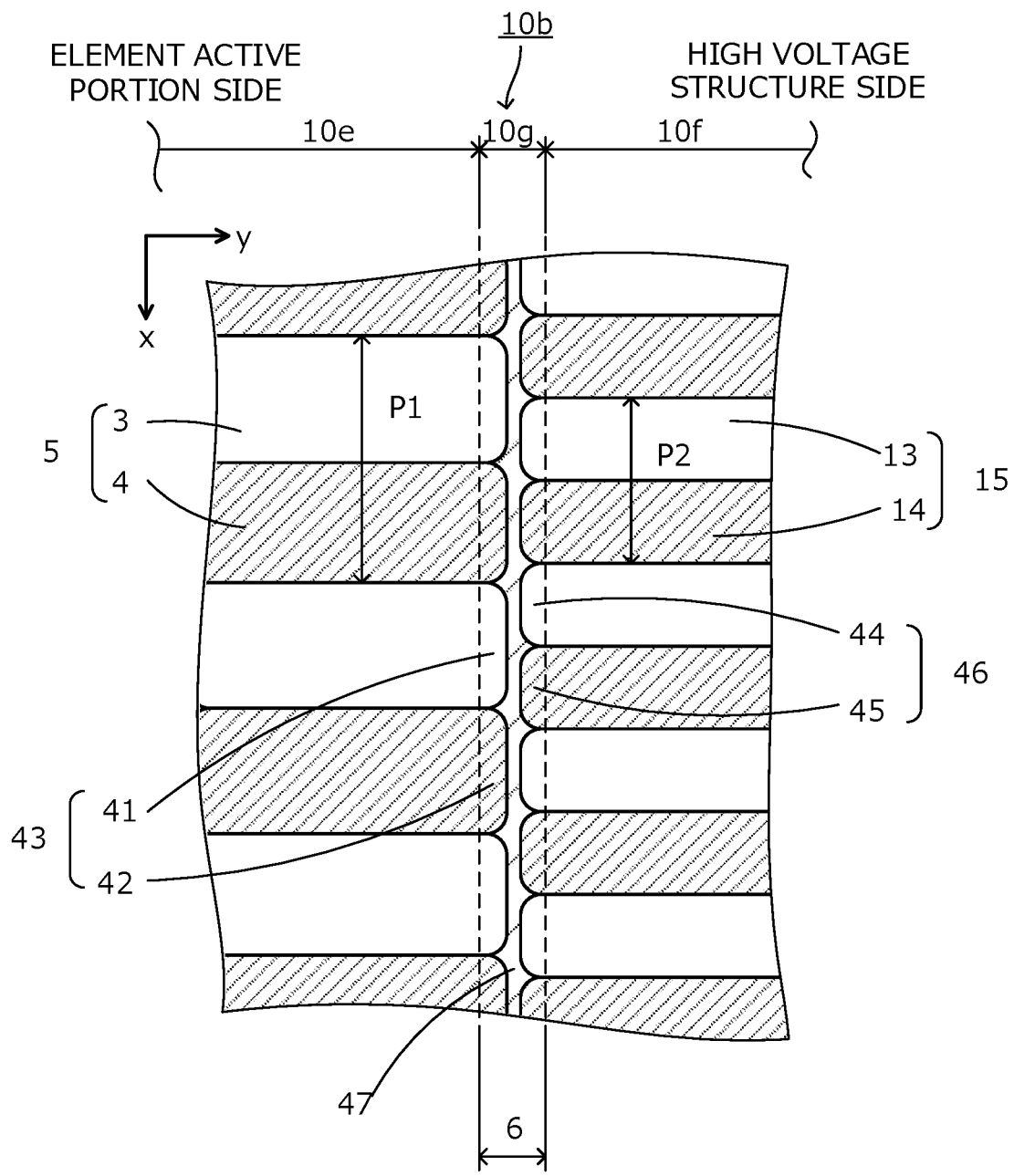

The manufacturing method of the semiconductor device according to the first embodiment will be described. FIGS. 6, 7, 8, 9, 10, and 11 are cross-sectional views of states during manufacturing of the semiconductor device according to the first embodiment. FIGS. 12 and 13 are top views of the semiconductor device according to the first embodiment during manufacturing. FIG. 12 depicts the state during formation of the first and the second parallel pn layers 5 and 15. Specifically, FIG. 12 depicts a planar layout of the impurity implanting regions after the first and the second ion implantations 32 and 34 and before the heat treatment for the formation of the first and the second parallel pn layers 5 and 15. FIG. 13 depicts the state of the intermediate region 6 after the heat treatment. Although FIGS. 6 to 11 depict the state during manufacturing of the first parallel pn layer 5 of the element active portion 10a and omit illustration of the state during manufacturing of the second parallel pn layer 15 of the high voltage structure 10c, the second parallel pn layer 15 is formed in the same manner as the first parallel pn layer 5, concurrently with the first parallel pn layer 5. Namely, the state in which the repetitive pitch is narrowed in FIGS. 6 to 11 is the state during manufacturing of the second parallel pn layer 15.

Figure 6:
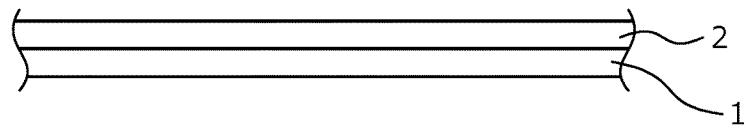
Figure 7:
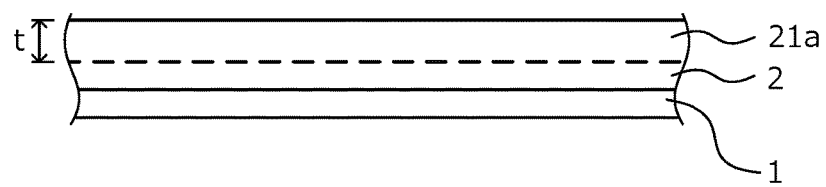
Figure 8:
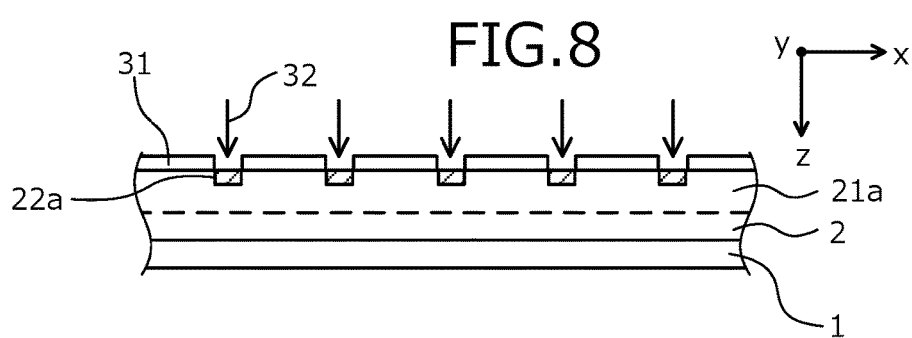

As depicted in FIG. 6, on the surface of an n⁺ type starting substrate that becomes the n+ type drain layer 1, the n-type buffer layer 2 is formed by the epitaxial growth. As depicted in FIG. 7, on the n-type buffer layer 2, a first-step n⁻ type semiconductor layer 21a is deposited (formed) to a predetermined thickness t by the epitaxial growth. As depicted in FIG. 8, on the n⁻ type semiconductor layer 21a, a resist mask 31 is formed that has openings at parts corresponding to forming regions of the first p-type region 4 of the first parallel pn layer 5 and the second p-type region 14 of the second parallel pn layer 15. The width in the second direction x of the opening of the resist mask 31 is narrower than the width in the second direction x of the first p-type region 4 in the element active portion 10a and is narrower than the width in the second direction x of the second p-type region 14 in the high voltage structure 10c. The width in the second direction x of the opening of the resist mask 31 is narrower in the high voltage structure 10c than in the element active portion 10a. The first ion implantation 32 of the p-type impurity is then performed, using the resist mask 31 as a mask. By this first ion implantation 32, in a surface layer of the n⁻ type semiconductor layer 21a, a p-type impurity implanting region 22a is selectively formed in the element active portion 10a and a p-type impurity implanting region 42a is selectively formed in the high voltage structure 10c (see FIG. 12). The depth of the p-type impurity implanting regions 22a and 42a is, for example, shallower than thickness t of n⁻ type semiconductor layer 21a.

As depicted in FIG. 9, after removal of the resist mask 31, a resist mask 33 is formed on the n⁻ type semiconductor layer 21a and has openings at the parts corresponding to the forming regions of the first n-type region 3 of the first parallel pn layer 5 and the second n-type region 13 of the second parallel pn layer 15. The width in the second direction x of the opening of the resist mask 33 is narrower than the width in the second direction x of the first n-type region 3 in the element active portion 10a and is narrower than the width in the second direction x of the second n-type region 13 in the high voltage structure 10c. The width in the second direction x of the opening of the resist mask 33 is narrower in the high voltage structure 10c than in the element active portion 10a. The second ion implantation 34 of the n-type impurity is then performed, using the resist mask 33 as a mask. By this second ion implantation 34, in the surface layer of the n⁻ type semiconductor layer 21a, an n-type impurity implanting region 23a is selectively formed in the element active portion 10a and an n-type impurity implanting region 43a is selectively formed in the high voltage structure 10c (see FIG. 12). The depth of the n-type impurity implanting regions 23a and 43a is, for example, shallower than thickness t of n⁻ type semiconductor layer 21a. The forming process of the n-type impurity implanting regions 23a and 43a and the forming process of the p-type impurity implanting regions 22a and 42a may be interchanged.

In the first and the second ion implantations 32 and 34 described above, as depicted in FIG. 12, the n-type impurity implanting region 23a and the p-type impurity implanting region 22a are arranged separated by a predetermined space d1 in the element active portion 10a. In the high voltage structure 10c, the n-type impurity implanting region 43a and the p-type impurity implanting region 42a are arranged separated by a predetermined space d2. Each of the impurity implanting regions 22a, 23a, 42a, and 43a of the element active portion 10a and the high voltage structure 10c is arranged so as to extend to the boundary region 10b between the element active portion 10a and the high voltage structure 10c. For example, in the first direction y, the n-type impurity implanting region 23a and the p-type impurity implanting region 22a of the element active portion 10a are arranged so as to extend to a first region 10e on the inner side of the boundary region 10b (on the element active portion 10a side). The n-type impurity implanting region 43a and the p-type impurity implanting region 42a of the high voltage structure 10c are arranged so as to extend to a second region 10f on the outer side of the boundary region 10b (on the high voltage structure 10c side). Further, by covering a third region 10g between the first region 10e and the second region 10f by the resist masks 31 and 33 to prevent the impurity from being ion-implanted in the third region 10g, the impurity implanting regions 22a and 23a of the element active portion 10a and the impurity implanting regions 42a and 43a of the high voltage structure 10c are arranged separated from each other in the first direction y. The third region 10g is a part that becomes the intermediate region 6 between the first and the second parallel pn layers 5 and 15 by the heat treatment to be described later. Width w4 in the first direction y of the third region 10g (intermediate region 6) is preferably ½ or less of thickness t of n⁻ type semiconductor layer 21a (w4≤t/2). The reason is that the first and the second parallel pn layers 5 and 15 are less susceptible to the adverse effect caused to each other, due to a difference in the repetitive pitch of the n-type region and the p-type region and the decrease in the breakdown voltage in the boundary region 10b is unlikely to occur. For example, when thickness t of the n⁻ type semiconductor layer 21a is on the order of 7 μm, width w4 in the first direction y of the intermediate region 6 may be, for example, on the order of 2 μm.

As depicted in FIG. 10, after removal of the resist mask 33, on the n⁻ type semiconductor layer 21a, plural n⁻ type semiconductor layers 21b to 21f are further deposited by the epitaxial growth, forming an epitaxial layer 24 having a predetermined thickness formed by these plural (e.g., six-step) n⁻ type semiconductor layers 21a to 21f. In such a process, each time one of the n⁻ type semiconductor layers 21b to 21e is deposited, the first and the second ion implantations 32 and 34 are performed, forming the p-type impurity implanting region and the n-type impurity implanting region in the element active portion 10a and the high voltage structure 10c, respectively, in the same manner as in the case of the first-step n⁻ type semiconductor layer 21a. The planar layout of the p-type impurity implanting region and the n-type impurity implanting region to be formed in each of the element active portion 10a and the high voltage structure region 10c is the same as that of the p-type impurity implanting region and the n-type impurity implanting region formed in the first-step n⁻ type semiconductor layer 21a. FIG. 10 depicts the state of the n⁻ type semiconductor layers 21b to 21e having the p-type impurity implanting regions 22b to 22e, respectively, formed therein and having the n-type impurity implanting regions 23b to 23e, respectively, formed therein, in the element active portion 10a. Among the n⁻ type semiconductor layers 21a to 21f making up the epitaxial layer 24, the n⁻ type semiconductor layer 21f at the uppermost step is not necessarily required to undergo the first and the second ion implantations 32 and 34. By these processes, an epitaxial substrate is formed by depositing the n-type buffer layer 2 and the epitaxial layer 24 sequentially on the surface of the n⁺ type starting substrate that becomes the n⁺ drain layer 1.

As depicted in FIG. 11, each n-type impurity implanting region and each p-type impurity implanting region in the n⁻ type semiconductor layers 21a to 21e are diffused by the heat treatment. Each n-type impurity implanting region and each p-type impurity implanting region, which are formed in the shape of a straight line extending in the first direction y, are diffused in a substantially cylindrical shape having the ion implanting position as a central axis. As a result, in the element active portion 10a, regions of the n-type impurity implanting regions 23a to 23e that oppose each other in the depth direction z are connected so as to overlap each other, forming the first n-type region 3 and at the same time, regions of the p-type impurity implanting regions 22a to 22e that oppose each other in the depth direction z are connected so as to overlap each other, forming the first p-type region 4. Concurrently, the first n-type region 3 and the first p-type region 4 are connected so as to overlap each other, forming the first parallel pn layer 5. Likewise, in the high voltage structure 10c, regions of the n-type impurity implanting regions (not depicted) that oppose each other in the depth direction z are connected so as to overlap each other, forming the second n-type region 13 and at the same time, regions of the p-type impurity implanting regions (not depicted) that oppose each other in the depth direction z are connected so as to overlap each other, forming the second p-type region 14. Concurrently, the second n-type region 13 and the second p-type region 14 are connected so as to overlap each other, forming the second parallel pn layer 15. Then, the n-type impurity and the p-type impurity are diffused from the n-type impurity implanting region and the p-type impurity implanting region, respectively, of the element active portion 10a and the high voltage structure 10c to the third region 10g of the boundary region 10b, forming the intermediate region 6.

Without specific limitation hereto, for example, when the semiconductor device according to the first embodiment is the vertical MOSFET, the rated breakdown voltage 600, and width w4 in the first direction y of the intermediate region 6 is on the order of 2 μm, conditions for the first and the second ion implantations 32 and 34 and the subsequent heat treatment for the impurity diffusion are as follows. In the first ion implantation 32, a dosage for the first p-type region 4 and the second p-type region 14 is on the order of $0.2 \times 10^{13}/cm^2$ or greater and $2.0 \times 10^{13}/cm^2$ or less. In the second ion implantation 34, the dosage for the first n-type region 3 and the second n-type region 13 is on the order of $0.2 \times 10^{13}/cm^2$ or greater and $2.0 \times 10^{13}/cm^2$ or less. The heat treatment temperature is on the order of 1000 degrees C. or greater and 1200 degrees C. or less.

FIG. 13 depicts the state of the intermediate region 6 after the heat treatment. In the third region 10g, in which no impurity is ion-implanted, between the impurity implanting regions that become the first and the second parallel pn layers 5 and 15 formed separated from each other by the first and the second ion implantations 32 and 34, the intermediate region 6 is formed that has the third parallel pn layer 43 and the fourth parallel pn layer 46 made by diffusion of these impurity implanting regions. For example, in an inner side (chip center side) part of the intermediate region 6 as the third region 10g, the third parallel pn layer 43 is formed that has the third n-type region 41 and the third p-type region 42 alternately arranged with the repetitive pitch about equal to the repetitive pitch P1 of the first n-type region 3 and the first p-type region 4 and having the impurity concentration decreasing toward the outer side. In an outer side part of the intermediate region 6, the fourth parallel pn layer 46 is formed that has the fourth n-type region 44 and the fourth p-type region 45 alternately arranged with the repetitive pitch about equal to the repetitive pitch P2 of the second n-type region 13 and the second p-type region 14 and having the impurity concentration decreasing toward the inner side. Namely, the third n-type region 41 having an average impurity concentration that is lower than that of the first n-type region 3, the fourth n-type region 44 having an average impurity concentration that is lower than that of the second n-type region 13, the third p-type region 42 having an average impurity concentration that is lower than that of the first p-type region 4, and the fourth p-type region 45 having an average impurity concentration that is lower than that of the second p-type region 14 are formed in the intermediate region 6 and the intermediate region 6 becomes a region that, in the off-state, is more easily depleted than the first parallel pn layer 5 and the second parallel pn layer 15.

The third parallel pn layer 43 and the fourth parallel pn layer 46 arranged in the intermediate region 6 oppose each other. Between the third parallel pn layer 43 and the fourth parallel pn layer 46, there is the transition region 47 to which the impurity of each of the impurity implanting regions of the first and the second parallel pn layers 5 and 15 having different pitches is diffused. In the third parallel pn layer 43 and the fourth parallel pn layer 46, the impurities between the impurity implanting regions that become the first and the second parallel pn layers 5 and 15 may diffuse and contact each other so as to overlap each other.

The planar layout of the second n-type region 13 and the second p-type region 14 is preferably stripe-like. The reason is that the average impurity concentrations of plural second n-type regions 13 and plural second p-type regions 14 are easily adjusted to be about equal and the charge balance of the second parallel pn layer 15 is easy to secure. Assuming that the second p-type regions 14 are arranged in the planar layout of a matrix and that the second n-type regions 13 are arranged in the planar layout of a lattice surrounding the second p-type region 14, in this case, the second p-type region 14 is of a substantially rectangular planar shape, while the second n-type region 13 is of a lattice-like planar shape having a surface area three times that of the second p-type region 14. For this reason, in view of the difficulty of studying the planar layout of the n-type impurity implanting region that becomes the second n-type region 13, and a limitation to processing accuracy of the resist mask, for the purpose of diffusing the n-type impurity evenly over the entire second n-type region 13, the average impurity concentration of each of the plural second n-type regions 13 may vary due to variation in the ion implantation. This adverse effect due to variation in the ion implantation is particularly remarkable in the high voltage structure 10c having the narrow repetitive pitch P2 of the second n-type region 13 and the second p-type region 14. In contrast, when the planar layout of the second n-type region 13 and the second p-type region 14 is stripe-like, both the second n-type region 13 and the second p-type region 14 have linear planar shapes of about equal surface areas. For this reason, by making the widths in the second direction x of the n-type impurity implanting region and the p-type impurity implanting region equal, the average impurity concentrations of the plural second n-type regions 13 and the plural second p-type regions 14 can be easily adjusted to be about equal.

The n-type channel stopper region 16 may be, for example, formed by the first ion implantation 32 concurrently with the formation of the first and the second p-type regions 4 and 14 or may be formed by ion-implanting the p-type impurity at a time different from that of the first ion implantation 32. The $n^-$ type region 12 may be formed by covering the forming region of the $n^-$ type region 12 by the resist masks 31 and 33 at the time of the first and the second ion implantations 32 and 34 or may be formed by further adding a process of selectively ion-implanting the n-type impurity. Then, remaining processes are sequentially performed such as processes of forming the MOS gate structure, the p-type outermost peripheral region 17, the interlayer insulation film 19, the source electrode 8, the channel stopper electrode 18, and the drain electrode 9, according to a general method. Thereafter, the superjunction semiconductor device depicted in FIGS. 1 to 5 is completed by dicing the epitaxial substrate into chips.

While, in the semiconductor device manufacturing method according to this first embodiment, the n-type buffer layer 2 is formed on the surface of the $n^+$ type starting substrate that becomes the $n^+$ type drain layer 1, the epitaxial layer 24 may be formed on the surface of the $n^+$ type starting substrate that becomes the $n^+$ type drain layer 1, without forming the n-type buffer 2.

Figure 14:
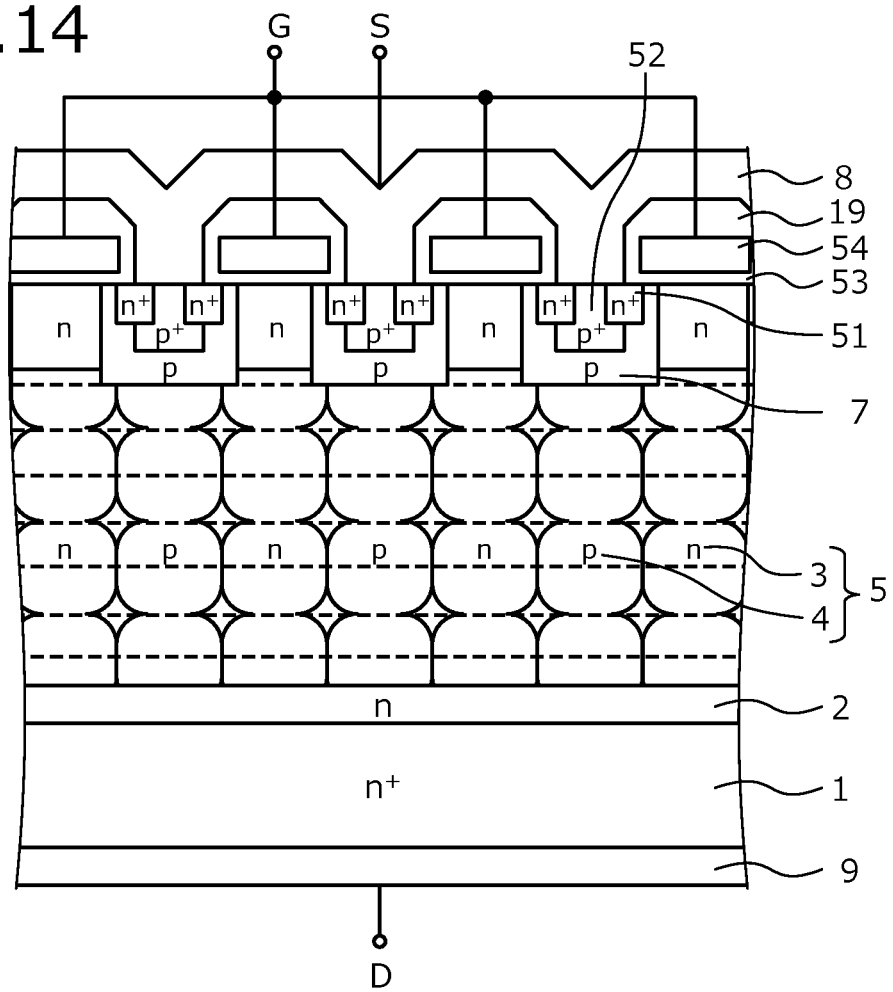
FIG. 14 is a cross-sectional view of an example of an element active portion of the semiconductor device according to the first embodiment.
Figure 15:
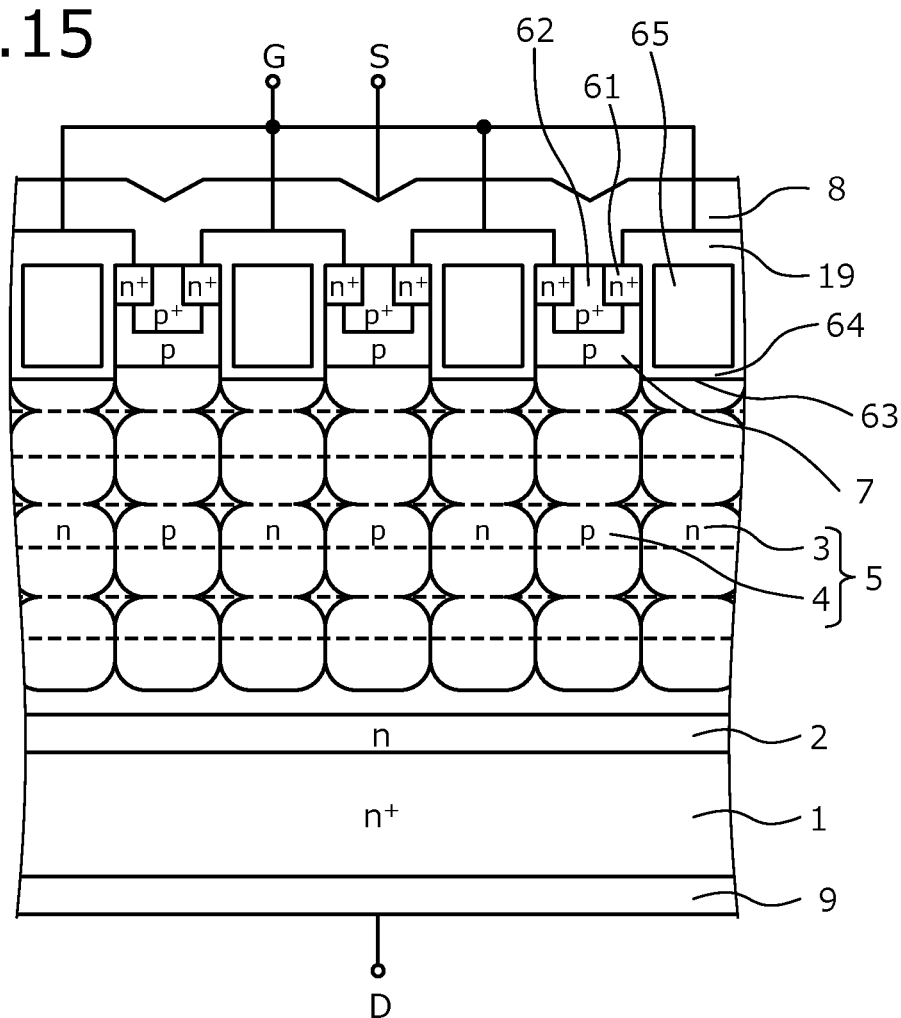
FIG. 15 is a cross-sectional view of another example of the element active portion of the semiconductor device according to the first embodiment.

An example will be described of the element active portion 10a of the semiconductor device according to the first embodiment. FIG. 14 is a cross-sectional view of an example of the element active portion of the semiconductor device according to the first embodiment. FIG. 15 is a cross-sectional view of another example of the element active portion of the semiconductor device according to the first embodiment. As depicted in FIG. 14, in the element active portion 10a, on the first principal surface side, a general MOS gate structure of a planar gate structure is disposed that is formed by the p-type base region 7, an $n^+$ type source region 51, a $p^+$ type contact region 52, a gate insulation film 53, and a gate electrode 54. As depicted in FIG. 15, in the element active portion 10a, on the first principal surface side, the general MOS gate structure of the planar gate structure may be disposed that is formed by the p-type base region 7, an $n^+$ type source region 61, a $p^+$ type contact region 62, a trench 63, a gate insulation film 64, and a gate electrode 65. These MOS gate structures may be made by arranging the p-type base region 7 so as to contact the first p-type region 4 of the first parallel pn layer 5 in the depth direction z. A dotted line in the first parallel pn layer 5 represents the boundary between the $n^-$ type semiconductor layers multi-stacked by the epitaxial growth at the time of formation of the first parallel pn layer 5.

Second Embodiment

Figure 16:
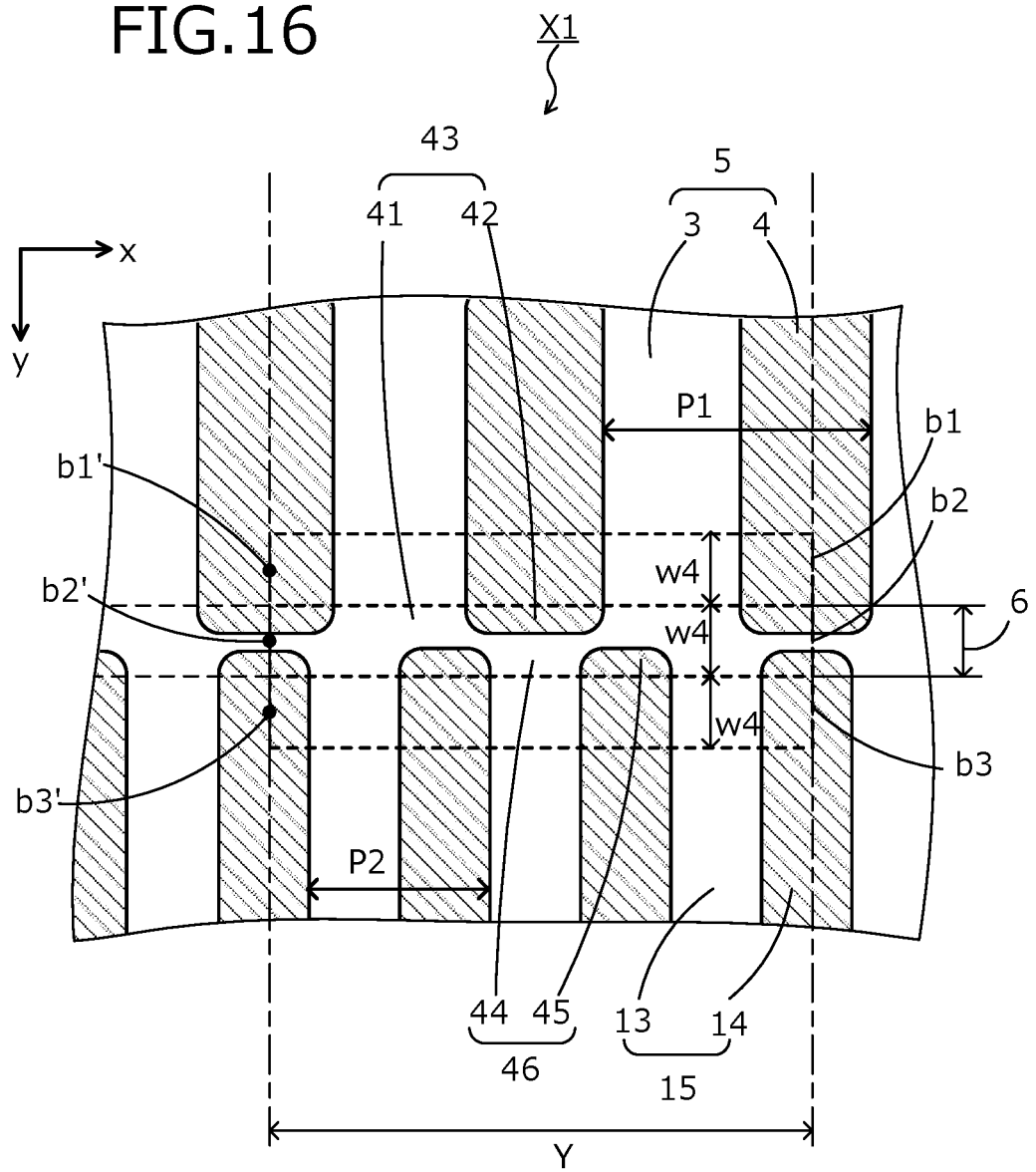
FIG. 16 is an enlarged top view of X1 part of FIG. 1.
Figure 17:
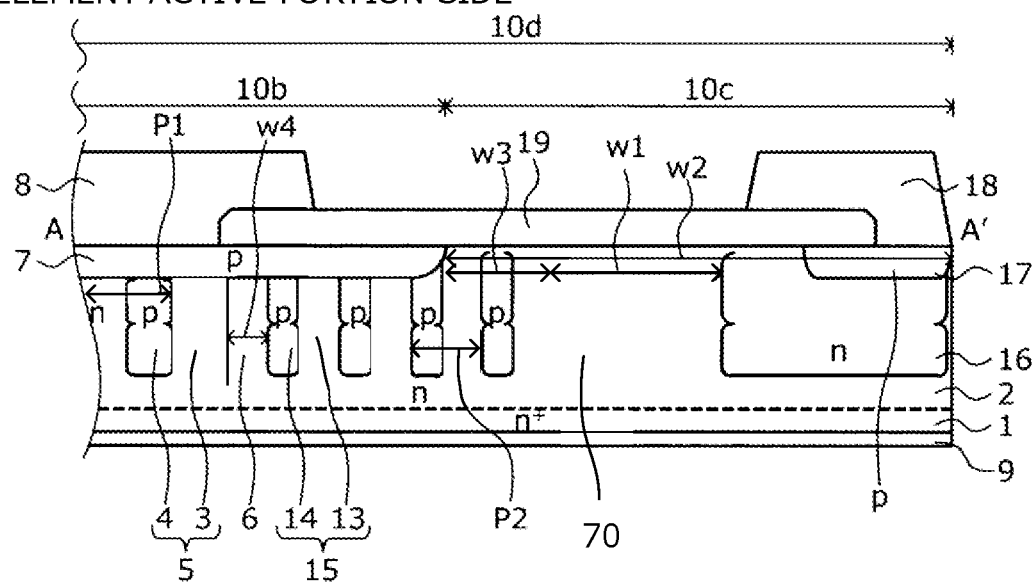
FIG. 17 is a cross-sectional view along cutline A-A' in FIG. 1.
Figure 18:
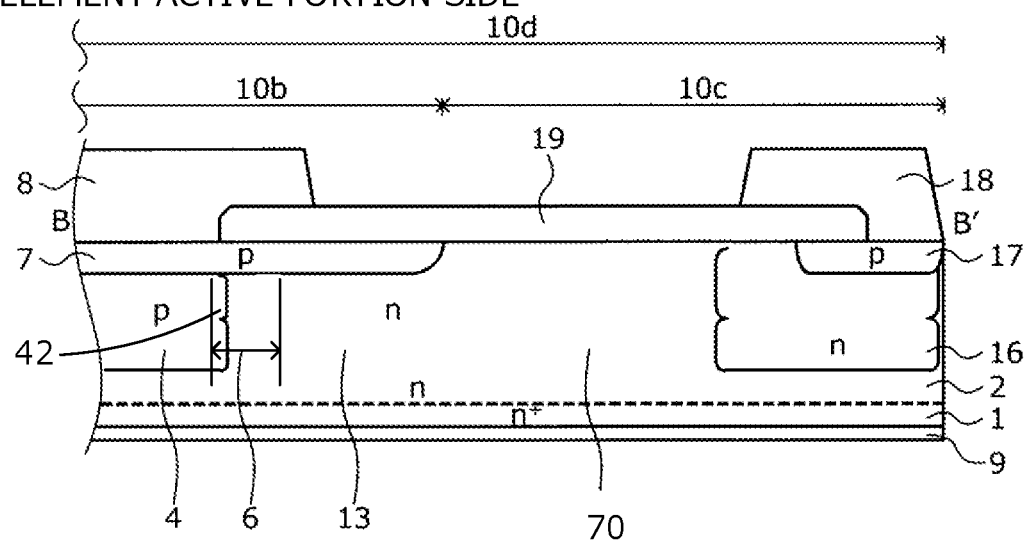
FIG. 18 is a cross-sectional view along cutline B-B' in FIG. 1.
Figure 19:
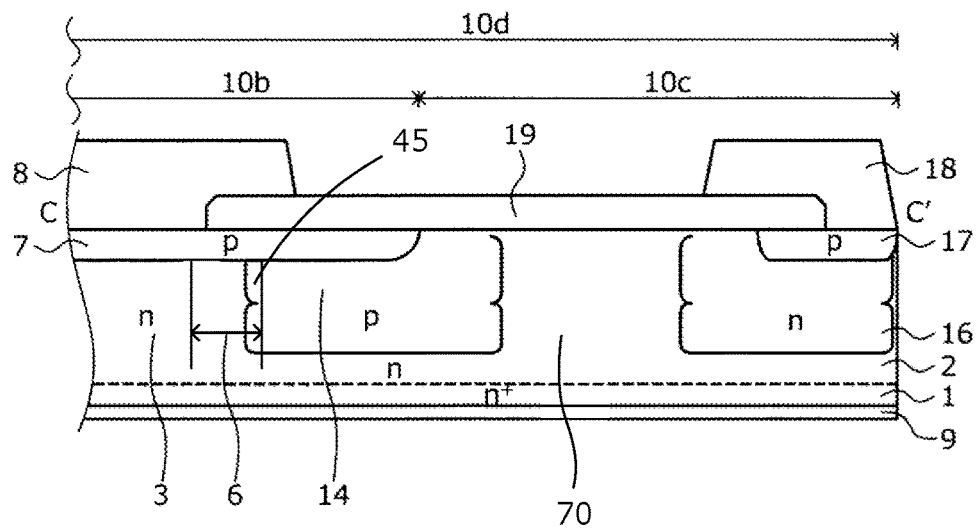
FIG. 19 is a cross-sectional view cutline C-C' in FIG. 1.

The structure of the semiconductor device according to a second embodiment will be described, taking the n-channel MOSFET having the superjunction structure as an example. A top view of the planar layout of the semiconductor device according to the second embodiment is the same as that of the planar layout of the semiconductor device according to the first embodiment. FIG. 16 is an enlarged top view of X1 part of FIG. 1. FIG. 17 is a cross-sectional view along cutline A-A' in FIG. 1. FIG. 18 is a cross-sectional view along cutline B-B' in FIG. 1. FIG. 19 is a cross-sectional view cutline C-C' in FIG. 1.

The semiconductor device according to the second embodiment differs from the semiconductor device according to the first embodiment in that the first n-type region 3, the second n-type region 13, the third n-type region 41, and the fourth n-type region 44 have a same average impurity concentration and are not formed by the n-type impurity ion implantation. The n-type impurity ion implantation for the formation of the first n-type region 3 and the second n-type region 13 is not performed and even in when the epitaxial substrate (n-type semiconductor layers 71a to 71f to be described later) is used, without changing the n-type impurity concentration, as the n-type region of the parallel pn layer, the same effect as that of the first embodiment can be obtained by having the intermediate region 6.

In the intermediate region 6 between the first and the second parallel pn layers 5 and 15, the third parallel pn layer 43 and the fourth parallel pn layer 46 are disposed by diffusing the impurity implanting regions, which become the first and the second parallel pn layers 5 and 15 formed to be separated from each other by the first ion implantation, to a region in which no impurity is implanted (third region) between such impurity implanting regions. For example, the inner side (chip center side) part of the intermediate region 6 has the third parallel pn layer 43 with the third p-type region 42 alternately arranged with the repetitive pitch about equal to the repetitive pitch P1 of the first n-type region 3 and the first p-type region 4, and having the impurity concentration decreasing toward the outer side. The outer side part of the intermediate region 6 has the fourth parallel pn layer 46 with the fourth p-type region 45 alternately arranged with the repetitive pitch about equal to the repetitive pitch P2 of the second n-type region 13 and the second p-type region 14, and having the impurity concentration decreasing toward the inner side. Namely, the intermediate region 6 is formed by the third n-type region 41 and the fourth n-type region 44 having about the same average impurity concentration as that of the first n-type region 3, the third p-type region 42 having an average impurity concentration that is lower than that of the first p-type region 4, and the fourth p-type region 45 having an average impurity concentration that is lower than that of the second p-type region 14.

The p-type impurity quantity of a region b1 of the first parallel pn layer 5 and a region b3 of the second parallel pn layer 15, having a same width w4 as that of an intermediate region b2 in section Y between the positions where the centers of the first p-type region 4 and the second p-type region 14 oppose each other, satisfies Cb2<(Cb1+Cb3)/2 with respect to the intermediate region b2 in section Y. Cb1 to Cb3 represent the p-type impurity quantity of the regions b1 to b3, respectively. For this reason, in the off-state, the intermediate region 6 is a region that is more easily depleted than the first parallel pn layer 5 is. Further, at the position where the centers of the first p-type region 4 and the second p-type region 14 oppose each other, the impurity concentration at the midpoint b2' of the intermediate region b2 in section Y is lower than the impurity concentration at the midpoint b1' of the region b1 of the first parallel pn layer 5 and the impurity concentration at the midpoint b3' of the region b3 of the second parallel pn layer 15. The third parallel pn layer 43 and the fourth parallel pn layer 46 arranged in the intermediate region 6 oppose each other. In the third parallel pn layer 43 and the fourth parallel pn layer 46, the impurities between the impurity implanting regions that become the first and the second parallel pn layers 5 and 15 may diffuse and contact each other so as to overlap each other.

Without particular limitation hereto, for example, when the semiconductor device according to the second embodiment is the vertical MOSFET and the rated breakdown voltage is 600V, the measurement and the impurity concentration of each portion may take the following values. The thickness of the drift region (thickness of the first parallel pn layer 5) is 35 μm and the width of the first n-type region 3 and the first p-type region 4 is 6.0 μm (repetitive pitch P1 is 12.0 μm). Peak impurity concentration in the width direction of the first n-type region 3 (n-type semiconductor layers 71a to 71f) arranged on the surface of an n-type semiconductor layer 71c corresponding to ½ the depth of the drift region (epitaxial layer 24 to be described later) is $4.0 \times 10^{15}/cm^3$. Peak impurity concentration in the width direction of the first p-type region 4 arranged on the surface of the n-type semiconductor layer 71c corresponding to ½ the depth of the drift region (epitaxial layer 24 to be described later) is $4.0 \times 10^{15}/cm^3$. The width of the second n-type region 13 and the second p-type region 14 is 4.0 μm (repetitive pitch P2 is 8.0 μm). The peak impurity concentration in the width direction of the second p-type region 14 arranged on the surface of the n-type semiconductor layer 71c corresponding to ½ the depth of the drift region (epitaxial layer 24 to be described later) is $2.0 \times 10^{15}/cm^3$. Width w4 of the intermediate region 6 is 2 μm. Width w2 of the high voltage structure 10c is 150 μm. Width w3 of such part of the second parallel pn layer 15 arranged in the high voltage structure 10c is 110 μm.

In the high voltage structure 10c, outside the second parallel pn layer 15, an n-type region 70 is disposed on the n-type buffer layer 2.

In this second embodiment, although the configuration has been depicted of disposing the first parallel pn layer 5 between the MOS gate structure and the n-type buffer layer 2 in the element active portion 10a and disposing the second parallel pn layer 15 on the n-type buffer 2 in the high voltage structure 10c, configuration may be such that the first parallel pn layer 5 is disposed between the MOS gate structure and the n⁺ type drain layer 1 and the second parallel pn layer 15 is disposed on the n+ type drain layer 1.

Figure 25:
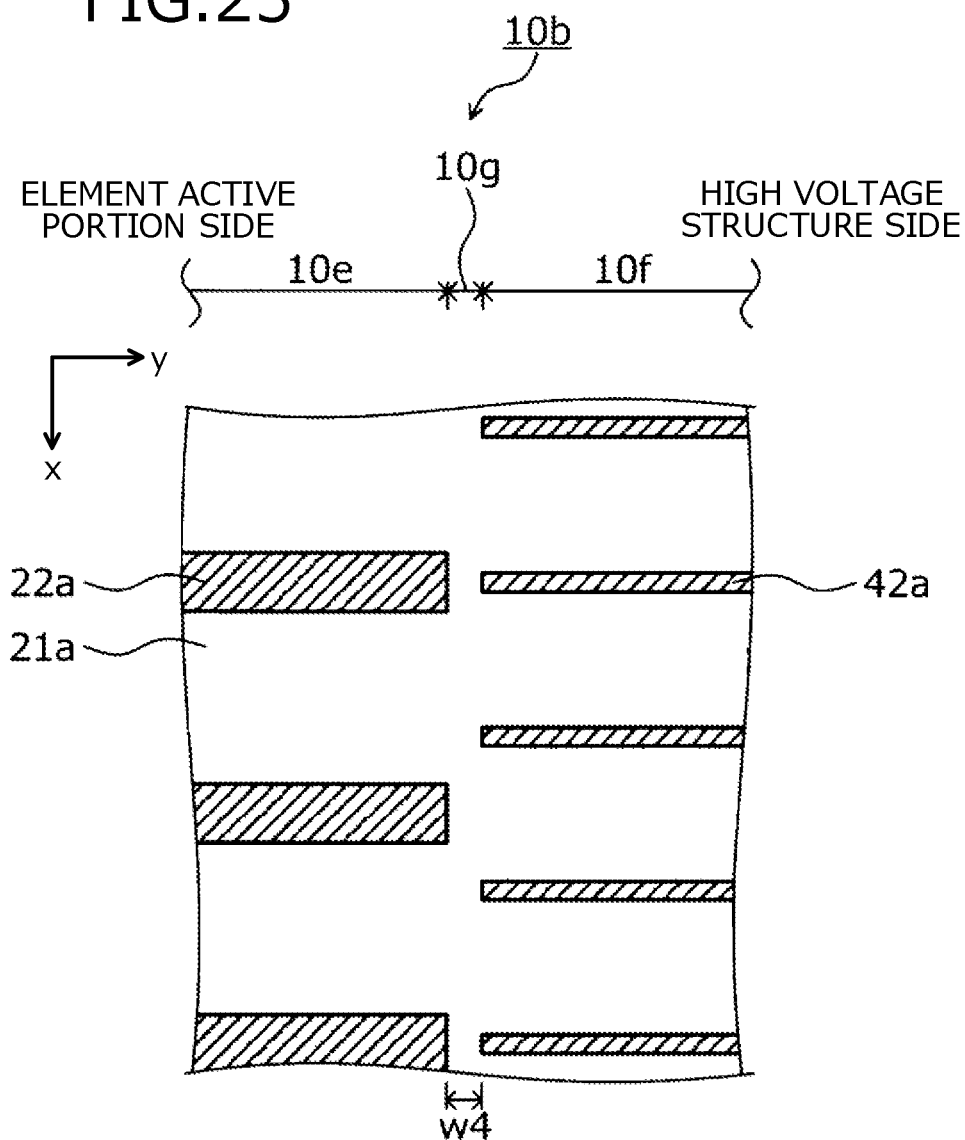
FIGS. 25 and 26 are top views of the semiconductor device according to the second embodiment during manufacturing.
Figure 26:
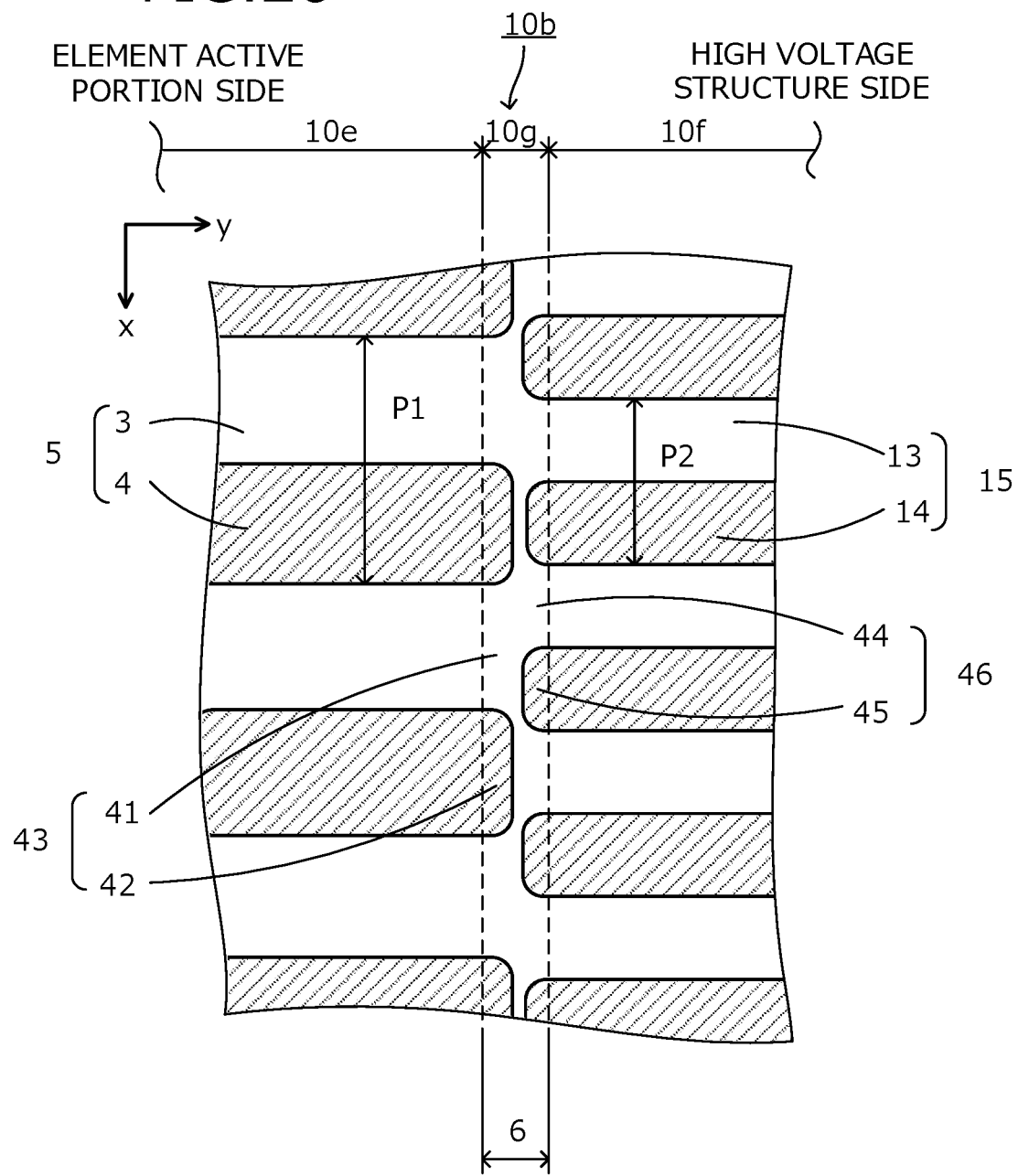
Figure 27A:
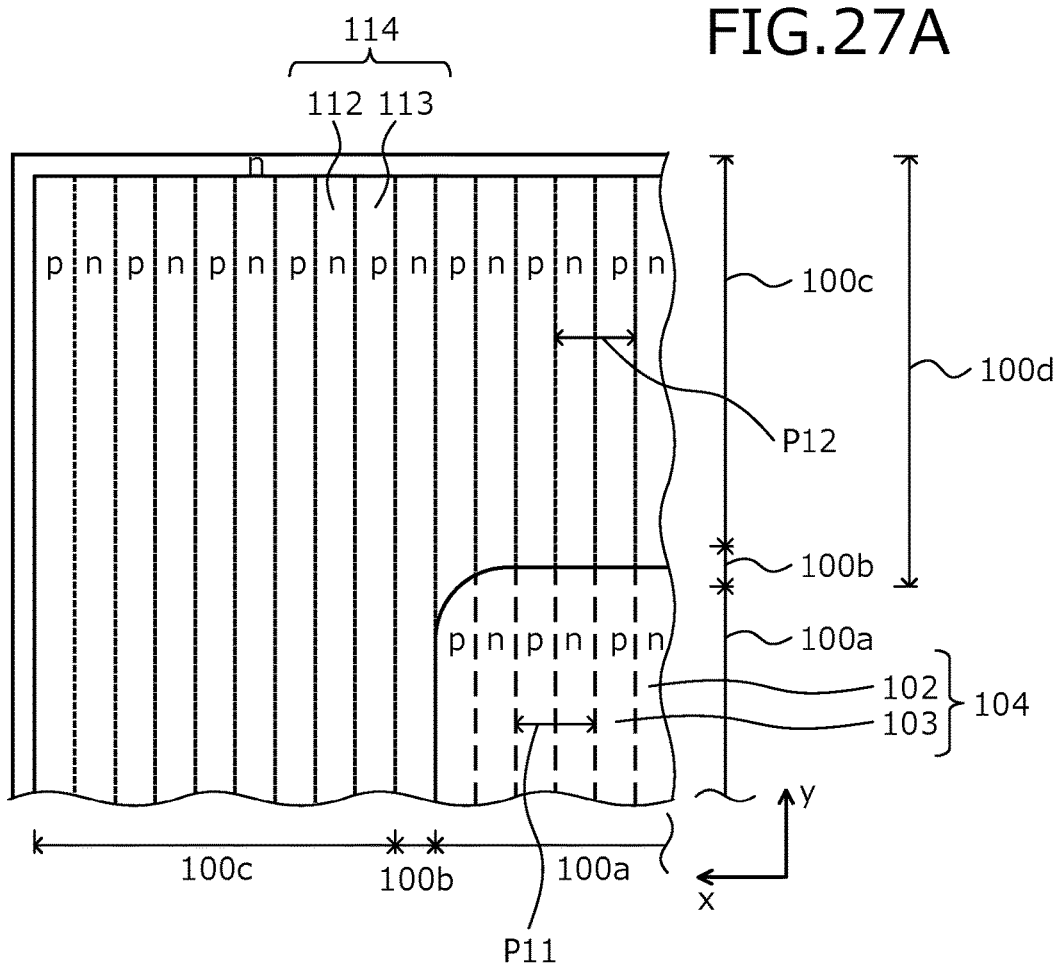
Figure 28A:
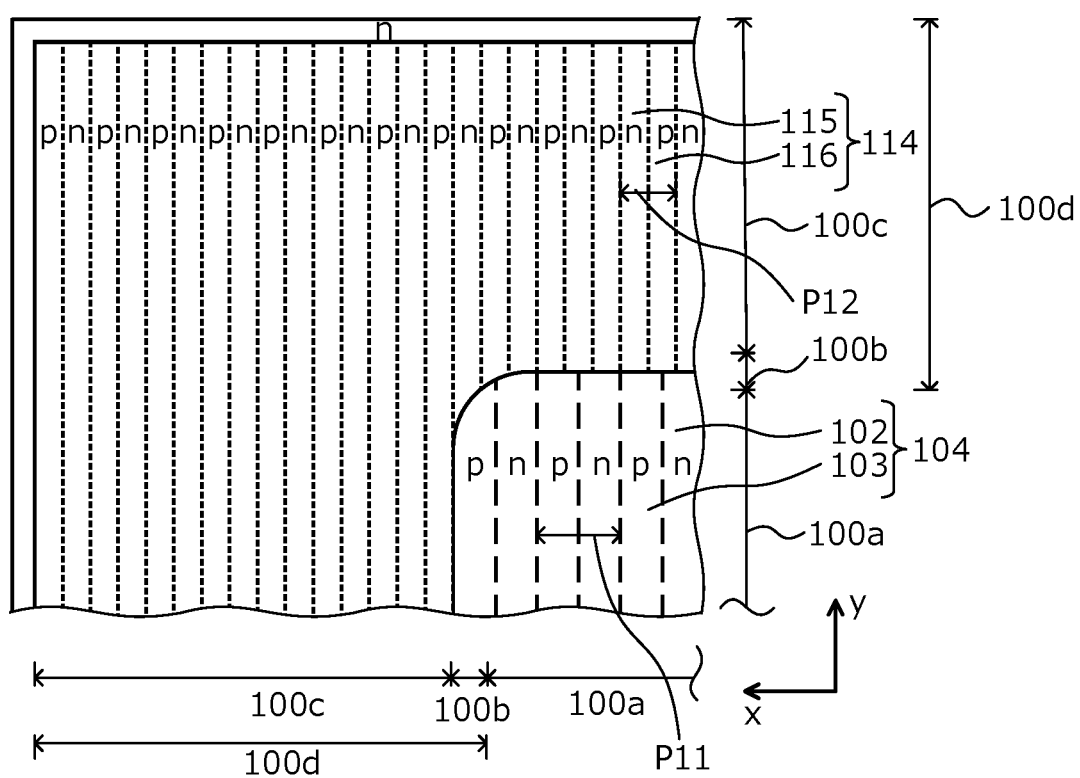

The manufacturing method will be described of the semiconductor device according to the second embodiment. FIGS. 20, 21, 22, 23, and 24 are cross-sectional views of states during manufacturing of the semiconductor device according to the second embodiment. FIGS. 25 and 26 are top views of the semiconductor device according to the second embodiment during manufacturing. FIG. 25 depicts a planar layout of the impurity implanting regions after the first ion implantation 32 and before the heat treatment for the formation of the first and the second parallel pn layers 5 and 15. FIG. 26 depicts the state of the intermediate region 6 after the heat treatment. The manufacturing method of the semiconductor device according to the second embodiment differs from that of the semiconductor device according to the first embodiment in that the second ion implantation 34 is not performed to ion-implant the n-type impurity.

Figure 20:
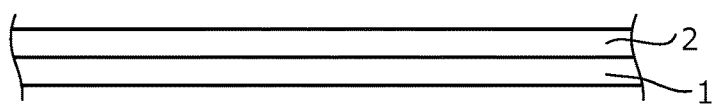
FIGS. 20, 21, 22, 23, and 24 are cross-sectional views of states during manufacturing of the semiconductor device according to a second embodiment.
Figure 21:
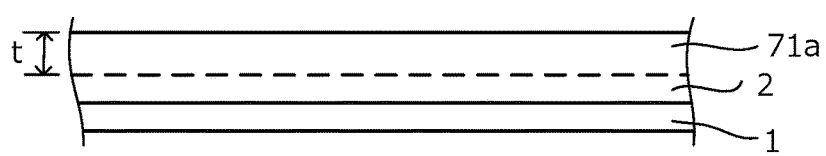
Figure 22:
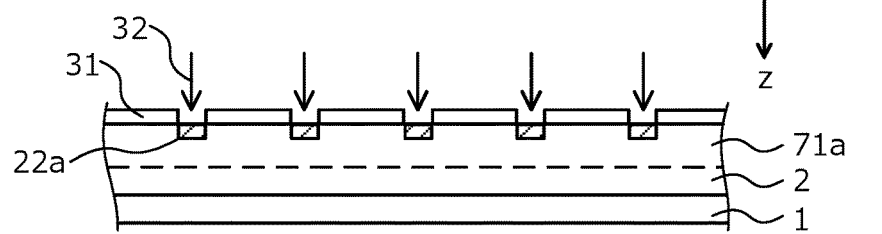

For example, as depicted in FIG. 20, on the surface of an n⁺ type starting substrate that becomes the n+ type drain layer 1, the n-type buffer layer 2 is formed by the epitaxial growth. As depicted in FIG. 21, on the n-type buffer layer 2, a first-step n-type semiconductor layer 71a is deposited (formed) to a predetermined thickness t by the epitaxial growth. As depicted in FIG. 22, on the n-type semiconductor layer 71a, the resist mask 31 is formed that has openings at parts corresponding to forming regions of the first p-type region 4 of the first parallel pn layer 5 and the second p-type region 14 of the second parallel pn layer 15. The width in the second direction x of the opening of the resist mask 31 is narrower than the width in the second direction x of the first p-type region 4 in the element active portion 10a and is narrower than the width in the second direction x of the second p-type region 14 in the high voltage structure 10c. The width in the second direction x of the opening of the resist mask 31 is narrower in the high voltage structure 10c than in the element active portion 10a. The first ion implantation 32 of the p-type impurity is then performed, using the resist mask 31 as a mask. By this first ion implantation 32, in a surface layer of the n-type semiconductor layer 71a, the p-type impurity implanting region 22a is selectively formed in the element active portion 10a and the p-type impurity implanting region 42a is selectively formed in the high voltage structure 10c (see FIG. 25). The depth of the p-type impurity implanting regions 22a and 42a is, for example, shallower than thickness t of the n-type semiconductor layer 71a.

In the first ion implantation 32 described above, as depicted in FIG. 25, the p-type impurity implanting regions 22a and 42a of the element active portion 10a and the high voltage structure 10c are arranged so as to extend to the boundary region 10b between the element active portion 10a and the high voltage structure 10c. For example, in the first direction y, the p-type impurity implanting region 22a of the element active portion 10a is arranged so as to extend to the first region 10e on the inner side of the boundary region 10b (on the element active portion 10a side). The p-type impurity implanting region 42a of the high voltage structure 10c is arranged so as to extend to the second region 10f on the outer side of the boundary region 10b (on the high voltage structure 10c side). Further, by covering the third region 10g between the first region 10e and the second region 10f by the resist mask 31 to prevent the impurity from being ion-implanted in the third region 10g, the p-type impurity implanting region 22a of the element active portion 10a and the p-type impurity implanting region 42a of the high voltage structure 10c are arranged separated from each other in the first direction y. The third region 10g is a part that becomes the intermediate region 6 between the first and the second parallel pn layers 5 and 15 by the heat treatment to be described later. Width w4 in the first direction y of the third region 10g (intermediate region 6) is preferably ½ or less of thickness t of the n-type semiconductor layer 71a (w4≤t/2). The reason is that the first and the second parallel pn layers 5 and 15 are less susceptible to the adverse effect caused to each other due to a difference in the repetitive pitch of the n-type region and the p-type region and the decrease in the breakdown voltage in the boundary region 10b is unlikely to occur. For example, when thickness t of the n⁻ type semiconductor layer 21a is on the order of 7 µm, width w4 in the first direction y of the intermediate region 6 may be, for example, on the order of 2 µm.

Figure 23:
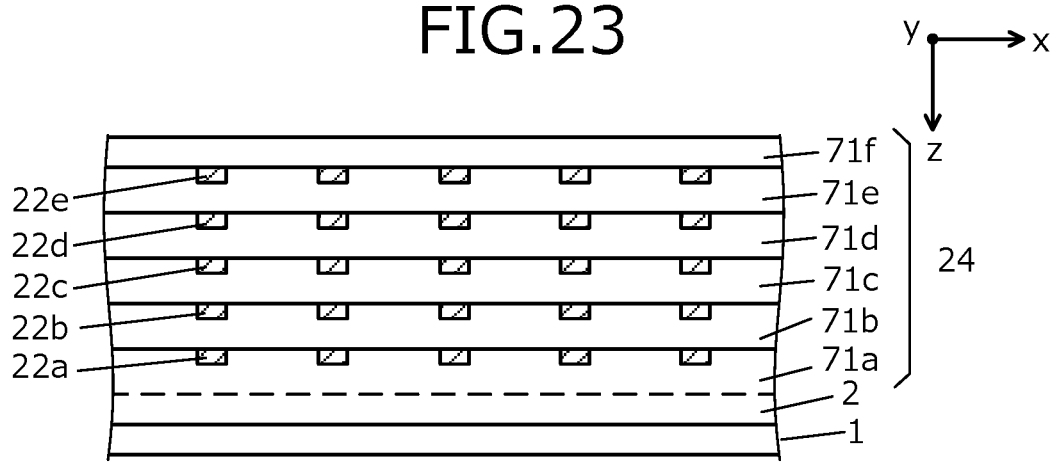

As depicted in FIG. 23, after removal of the resist mask 31, on the n-type semiconductor layer 71a, plural n-type semiconductor layers 71b to 71f are further deposited by the epitaxial growth, forming the epitaxial layer 24 having a predetermined thickness formed of these plural (e.g., six-step) n-type semiconductor layers 71a to 71f. In such a process, each time one of the n-type semiconductor layers 71b to 71e is deposited, the first ion implantation 32 is performed, forming the p-type impurity implanting region in each of the element active portion 10a and the high voltage structure 10c, in the same manner as in the case of the first-step n-type semiconductor layer 71a. The planar layout of the p-type impurity implanting region formed in the element active portion 10a and the high voltage structure region 10c, respectively, is the same as that of the p-type impurity implanting region formed in the first-step n-type semiconductor layer 71a. FIG. 23 depicts the state of the n-type semiconductor layers 71b to 71e having the p-type impurity implanting regions 22b to 22e, respectively, formed therein, in the element active portion 10a. Out of the n-type semiconductor layers 71a to 71f forming the epitaxial layer 24, the n-type semiconductor layer 71f at the uppermost step is not necessarily required to undergo the first ion implantation 32. By these processes, the epitaxial substrate is formed by depositing the n-type buffer layer 2 and the epitaxial layer 24 sequentially on the surface of the n⁺ type starting substrate that becomes the n⁺ drain layer 1.

Figure 24:
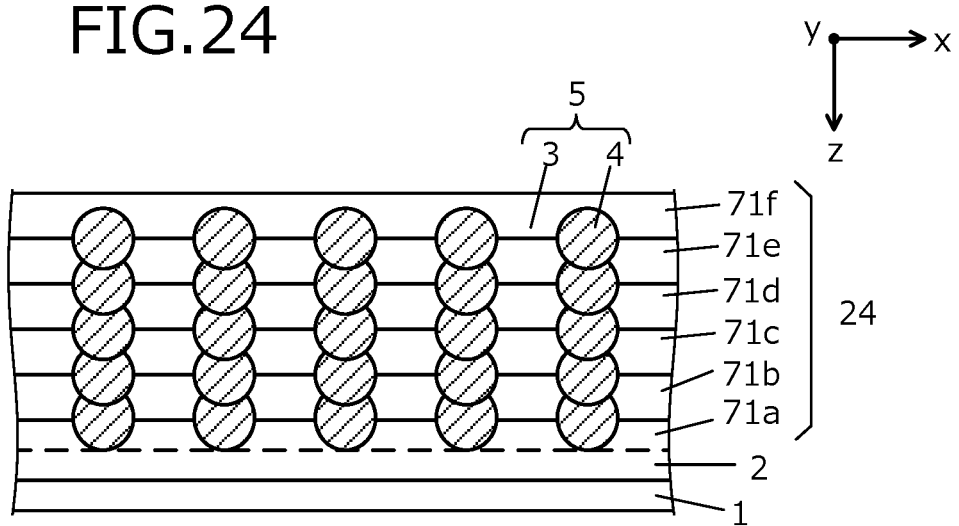

As depicted in FIG. 24, each p-type impurity implanting region in the n-type semiconductor layers 71a to 71e is diffused by the heat treatment. Each p-type impurity implanting region, which is formed in the shape of a straight line extending in the first direction y, is diffused in a substantially cylindrical shape having the ion implanting position as a central axis. Thus, in the element active portion 10a, regions of the p-type impurity implanting regions 22a to 22e that oppose each other in the depth direction z are connected so as to overlap each other, forming the first p-type region 4. Likewise, in the high voltage structure 10c, regions of the p-type impurity implanting regions (not depicted) that oppose each other in the depth direction z are connected so as to overlap each other, forming the second p-type region 14. Then, the p-type impurity is diffused from each p-type impurity implanting region of the element active portion 10a and the high voltage structure 10c to the third region 10g of the boundary region 10b, forming the intermediate region 6.

Without specific limitation hereto, for example, when the semiconductor device according to the second embodiment is the vertical MOSFET, the rated breakdown voltage is 600 V, and width w4 in the first direction y of the intermediate region 6 is on the order of 2 µm, conditions for the first ion implantation 32 and the subsequent heat treatment for the impurity diffusion may be as follows. In the first ion implantation 32, a dosage for the first p-type region 4 and the second p-type region 14 is on the order of $0.2 \times 10^{13}/cm^2$ or over and $2.0 \times 10^{13}/cm^2$ or less. The heat treatment temperature is on the order of 1000 degrees C. or greater and 1200 degrees C. or less.

FIG. 26 depicts the state of the intermediate region 6 after the heat treatment. In the third region 10g, in which no impurity is ion-implanted, between the p-type impurity implanting regions that become the first and the second parallel pn layers 5 and 15 formed separated from each other by the first ion implantation 32, the intermediate region 6 is formed that has the third parallel pn layer 43 and the fourth parallel pn layer 46 formed by diffusion of these impurity implanting regions. For example, in the inner side (chip center side) part of the intermediate region 6 as the third region 10g, the third parallel pn layer 43 is formed that has the third p-type region 42 alternately arranged with the repetitive pitch about equal to the repetitive pitch P1 of the first n-type region 3 and the first p-type region 4, and having the impurity concentration decreasing toward the outer side. In the outer side part of the intermediate region 6, the fourth parallel pn layer 46 is formed that has the fourth p-type region 45 alternately arranged with the repetitive pitch about equal to the repetitive pitch P2 of the second n-type region 13 and the second p-type region 14, and having the impurity concentration decreasing toward the inner side. Namely, the third n-type region 41 and the fourth n-type region 44 having about the same average impurity concentration as that of the first n-type region 3, and the third p-type region 42 and the fourth p-type region 45 having an average impurity concentration that is lower than that of the first p-type region 4, are formed in the intermediate region 6 and the intermediate region 6 becomes a region that, in the off-state, is more easily depleted than the first parallel pn layer 5.

The third parallel pn layer 43 and the fourth parallel pn layer 46 arranged in the intermediate region 6 oppose each other. In the third parallel pn layer 43 and the fourth parallel pn layer 46, the impurities between the impurity implanting regions that become the first and the second parallel pn layers 5 and 15 may diffuse and contact each other so as to overlap each other. While the second embodiment differs from the first embodiment in that the second ion implantation 34 is not performed in the first n-type region 3 or the second n-type region 13, the element active portion 10a of the semiconductor device according to the second embodiment is of the same configuration as that of the element active portion 10a of the semiconductor device according to the first embodiment.

Third Embodiment

Figure 29:
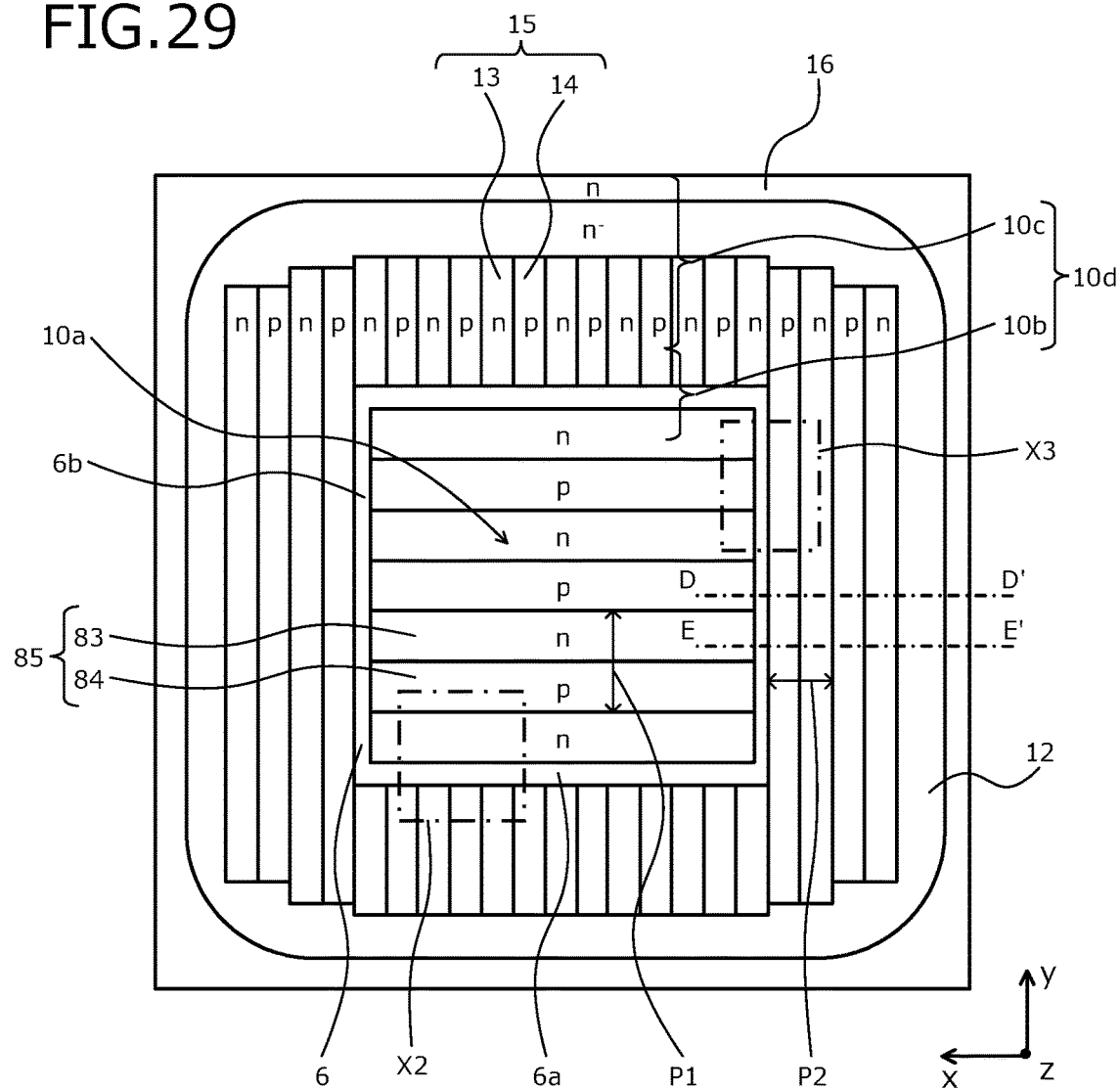
FIG. 29 is a top view of a planar layout of the semiconductor device according to a third embodiment.
Figure 30:
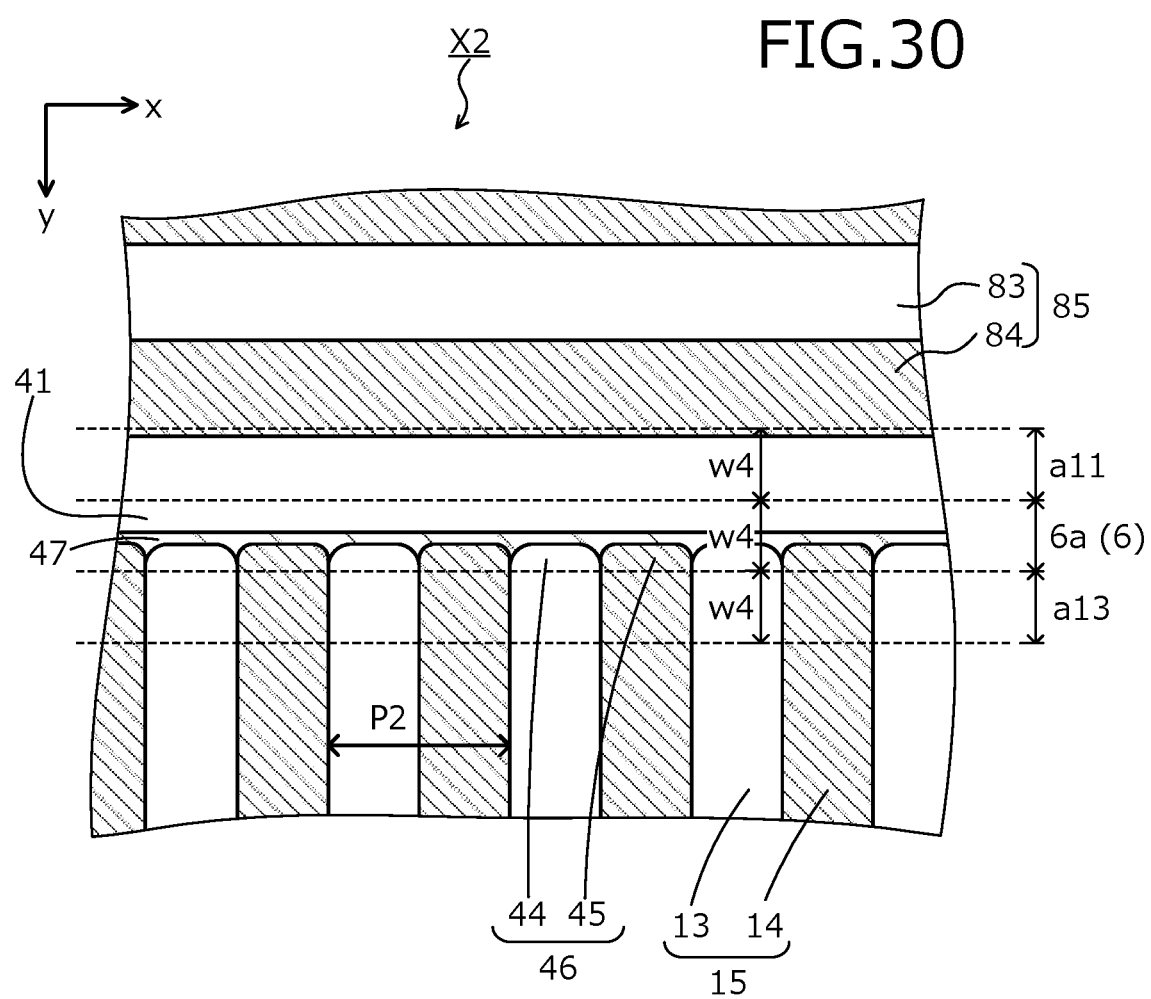
FIG. 30 is an enlarged top view of X2 portion of FIG. 29.

A structure of the semiconductor device according to a third embodiment will be described, taking the n-channel MOSFET with the superjunction structure as an example. FIG. 29 is a top view of a planar layout of the semiconductor device according to the third embodiment. FIG. 30 is an enlarged top view of X2 portion of FIG. 29. FIG. 31 is an enlarged top view of X3 portion of FIG. 29. FIG. 32 is a cross-sectional view along cutline D-D' in FIG. 29. FIG. 33 is a cross-sectional view along cutline E-E' in FIG. 29. FIG. 29 depicts the shape of an element active portion 10a and an element edge portion 10d at a plane crossing the first and the second parallel pn layers 85 and 15, e.g., a plane at a depth ½ of that of the first parallel pn layer 85 of the element active portion 10a. In FIG. 29, to clarify a difference between the repetitive pitch P1 of a first n-type region 83 and a first p-type region 84 and the repetitive pitch P2 of the second n-type region 13 and the second p-type region 14, a fewer number of these regions are depicted than in FIGS. 30 to 34.

The semiconductor device according to the third embodiment differs from the semiconductor device according to the first embodiment in that the first parallel pn layer 85 is arranged in the planar layout of the stripe extending in the direction orthogonal to the direction in which the stripe of the second parallel pn layer 15 extends (FIGS. 29 to 33). In the third embodiment, the lateral direction in which the stripe of the first parallel pn layer 85 extends is given as a second direction x and the lateral direction in which the stripe of the second parallel pn layer 15 extends is given as a first direction y. The configuration, other than the planar layout of the first parallel pn layer 85, of the element active portion 10a is the same as in the first embodiment. The configuration of the element edge portion 10d is the same as in the first embodiment. The second parallel pn layer 15 surrounds the first parallel pn layer 85 with the intermediate region 6 therebetween and contacting the first parallel pn layer 85 by way of the intermediate region 6, in the same manner as in the first embodiment.

Namely, the arrangement of the third and the fourth parallel pn layers 43 and 46 differs between a linear part (hereinafter, first linear part) 6b parallel to the first direction y of the intermediate region 6 arranged in the planar layout of a substantially rectangular frame shape and a linear part (hereinafter, second linear part) 6a parallel to the second direction x. The third and the fourth parallel pn layers 43 and 46 are formed by diffusing the impurity implanting regions that become the first and the second parallel pn layers 85 and 15, respectively, to a region in which no impurity is ion-implanted (third region described above) between such impurity implanting regions, in the same manner as in the first embodiment. Conditions of the repetitive pitch P1 of the first n-type region 83 and the first p-type region 84 and the repetitive pitch P2 of the second n-type region 13 and the second p-type region 14 are the same as in the first embodiment.

As depicted in FIG. 30, for example, the first n-type region 83, on the outermost side of the repetition of the first n-type region 83 and the first p-type region 84 of the first parallel pn layer 85 is opposed to the end of the stripe of the second n-type region 13 and the second p-type region 14 of the second parallel pn layer 15, with the second linear part 6a of the intermediate region 6 therebetween in the direction (first direction y) orthogonal to the stripe of the first parallel pn layer 85. Namely, in an inner side part of the second linear portion 6a of the intermediate region 6, only the third n-type region 41 of the third parallel pn layer 43 is arranged and in an outer side part across the transition region 47, the fourth parallel pn layer 46 is arranged that is formed by the alternate repletion in the second direction x of the fourth n-type region 44 and the fourth p-type region 45.

The transition region 47 in the second linear part 6a of the intermediate region 6 is a region to which the impurities of the impurity implanting regions that become, for example, the first n-type region 83 of the first parallel pn layer 85 and the second n-type region 13 and the second p-type region 14 of the second parallel pn layer 15 are diffused. The n-type impurity quantity of a region a11 of the first parallel pn layer 85 and a region a13 of the second parallel pn layer 15, having the same width w4 as that of the second linear part a6 of the intermediate region 6, satisfies Ca12<(Ca11+Ca13)/2 with respect to the second linear part 6a of the intermediate region 6. Ca11 to Ca13 represent the n-type impurity quantity of the region a11, the second linear part 6a, and the region a13, respectively. The p-type impurity quantity of the second linear part 6a of the intermediate region 6 decreases from the outer side toward the inner side.

On the other hand, as depicted in FIG. 31, for example, the second n-type region 13, on the innermost side of the repetition of the second n-type region 13 and the second p-type region 14 of the second parallel pn layer 15, is opposed to the end of the stripe of the first n-type region 83 and the first p-type region 84 of the first parallel pn layer 85, with the first linear part 6b of the intermediate region 6 therebetween in the direction (second direction x) orthogonal to the stripe of the second parallel pn layer 15. Namely, in the inner side part of the first linear portion 6b of the intermediate region 6, the third parallel pn layer 43 is arranged that is formed by the alternate repletion in the first direction y of the third n-type region 41 and the third p-type region 42 and in the outer side part across the transition region 47, only the fourth n-type region 44 of the fourth parallel pn layer 46 is arranged.

The transition region 47 in the first linear part 6b of the intermediate region 6 is a region to which the impurities of the impurity implanting regions that become the first n-type region 83 and the first p-type region 84 of the first parallel pn layer 85 and, for example, the second n-type region 13 of the second parallel pn layer 15 are diffused. The n-type impurity quantity of a region a21 of the first parallel pn layer 85 and a region a23 of the second parallel pn layer 15, having the same width w4 as that of the first linear part 6b of the intermediate region 6, satisfies Ca22<(Ca21+Ca23)/2 with respect to the first linear part 6b of the intermediate region 6. Ca21 to Ca23 represent the n-type impurity quantity of the region a21, the first linear part 6b, and the region a23, respectively. The p-type impurity quantity of the first linear part 6b of the intermediate region 6 decreases from the inner side toward the outer side.

The manufacturing method of the semiconductor device according to the third embodiment can be achieved by changing the planar layout of the resist masks 31 and 33 (see FIGS. 8 to 10) used in the first and the second ion implantations 32 and 34 for the formation of the first and the second parallel pn layers 85 and 15, in the manufacturing method of the semiconductor device according to the first embodiment. For example, the resist mask 31 used for the first ion implantation 32 has openings in the planar layout of a part corresponding to the forming regions of the first p-type region 84 of the first parallel pn layer 85 respectively intersecting a part corresponding to the forming regions of the second p-type region 14 of the second parallel pn layer 15. The resist mask 33 used for the second ion implantation 34 has openings in the planar layout of a part corresponding to the forming regions of the first n-type region 83 of the first parallel pn layer 85 respectively intersecting a part corresponding to the forming regions of the second n-type region 13 of the second parallel pn layer 15.

In the third embodiment, when the rated breakdown voltage is 600 V, the impurity concentration of the intermediate region 6 (first and second linear parts 6b and 6a) is preferably, for example, on the order of $1.0 \times 10^{14}/cm^3$ or less. When the rated breakdown voltage is 300 V, the impurity concentration is preferably, for example, on the order of $1.0 \times 10^{15}/cm^3$ or less.

The third embodiment may be applied to the semiconductor device according to the second embodiment.

As described above, according to each embodiment described above, by forming the third region in which no impurity is ion-implanted between the impurity implanting regions that become the first parallel pn layer and the impurity implanting regions that become the second parallel pn layer and thermally diffusing each impurity implanting region to this third region, the intermediate region can be formed that has the third parallel pn layer having an average impurity concentration that is lower than that of the first parallel pn layer and the fourth parallel pn layer having an average impurity concentration that is lower than that of the second parallel pn layer, between the first and the second parallel pn layers. Since the impurity quantity of the intermediate region is lower than that of the first parallel pn layer, the intermediate layer is more readily depleted and has less concentration of electric field than the first parallel pn layer. For this reason, even if, in the high voltage structure, the second parallel pn layer having the repetitive pitch of the n-type region and the p-type region narrower than that in the element active portion is arranged to make the breakdown voltage of the high voltage structure higher than that of the element active portion, a charge balance change in the boundary region between the element active portion and the high voltage structure does not adversely affect each other. For this reason, the decrease in the breakdown voltage does not occur in the boundary region between the element active portion and the high voltage structure. Therefore, since the charge balances of the first and the second parallel pn layers can be individually adjusted, the breakdown voltage of the element edge portion (high voltage structure and boundary region) can be easily made higher than that of the element active portion, achieving a high breakdown voltage of the element as a whole. For this reason, reliability can be enhanced. Even if the average impurity concentration of the first parallel pn layer is increased to achieve low on-resistance, the difference in the breakdown voltage between the element edge portion and the element active portion can be maintained. Therefore, the on-resistance can be reduced while suppressing decreases in the breakdown voltage. Since breakdown can be caused earlier in the element active portion than in the element edge portion by making the breakdown voltage of the element edge portion higher than that of the element active portion, an avalanche resistance and a reverse recovery resistance can be enhanced.

In a conventional (for example, refer to FIG. 8 of Japanese Laid-Open Patent Publication No. 2008-294214) configuration of disposing a guard ring in the element edge portion, since plural guard rings are arranged concentrically around the element active portion, separated from each other, the width of the element edge portion tends to be long. On the other hand, according to each embodiment described above, the second p-type region of the second parallel pn layer disposed in the element edge portion performs a function similar to that of a guard ring. For this reason, by disposing the second parallel pn layer in the element edge portion, the element edge portion can be easily depleted in the off-time and therefore, it becomes unnecessary to dispose the guard ring in the element edge portion, whereby lengthening of the width of the high voltage structure can be prevented. According to each embodiment described above, by disposing the $n^-$ type region outside the second parallel pn layer, quick depletion up to the second parallel pn layer is enabled and the expansion of the depletion layer extending outside the second parallel pn layer can be suppressed, in the off-state. As a result, since the depletion layer hardly reaches the n-type channel stopper region and a local concentration of electric field hardly occurs in the vicinity of the n-type channel stopper, decreases in the breakdown voltage can be suppressed. The width of the high voltage structure can be shortened by suppressing the expansion of the depletion layer by the $n^-$ type region and the n-type region disposed outside the second parallel pn layer. According to the third embodiment, even in the case of a planar layout where the direction in which the stripe of the first parallel pn layer extends and the direction in which the stripe of the second parallel pn layer extends intersect, the charge balances of the first and the second parallel pn layers can be adjusted individually. For this reason, the degree of freedom in design is high.

Herein, the present invention is not limited to the embodiments described above and can be variously changed without departing from the intent of the present invention. For example, the measurement, the impurity concentration, etc., described in the above embodiments are one example and the present invention is not limited to such values. While the first conductive type is given as the n-type and the second conductive type is given as the p-type in the embodiments described above, the present invention applies in the same manner even when the first conductive type is given as the p-type and the second conductive type is given as the n-type. The present invention is not limited to a MOSFET but can also be applied to an insulated gate bipolar transistor (IGBT), a bipolar transistor, a freewheeling diode (FWD), a Schottky diode, etc.

As described, the semiconductor device and the manufacturing method of the semiconductor device according to the present invention are useful for a high-power semiconductor device having the high voltage structure in the element edge portion surrounding the element active portion and are particularly useful for a high breakdown voltage semiconductor device such as a MOSFET, an IGBT, a bipolar transistor, a FWD, and a Schottky diode using the drift layer as the parallel pn layer.

According to the above invention, by forming, between the impurity implanting region that becomes the first parallel pn layer and the impurity implanting region that becomes the second parallel pn layer, a region in which no impurity is ion-implanted and by thermally diffusing each of the impurity implanting regions to this region, an intermediate region can be formed, between the first and the second parallel pn layers, that has the third parallel pn layer having an average impurity concentration that is lower than that of the first parallel pn layer and the fourth parallel pn layer having an average impurity concentration lower that is than that of the second parallel pn layer. Since the impurity quantity of the intermediate region is lower than that of the first parallel pn layer, the intermediate region depletes more readily than the first parallel pn layer and the intermediate region is less prone to electric field concentration than the first parallel pn layer. For this reason, even if the second parallel pn layer having the repetitive pitch of the n-type region and the p-type region narrower than that of the element active portion is arranged in the high voltage structure (termination side portion of element edge portion) and the breakdown voltage of the high voltage structure is made higher than that of the element active portion, a decrease in the breakdown voltage does not occur in the boundary region between the element active portion and the high voltage structure. Therefore, since the charge balances of the first and the second parallel pn layers can be separately adjusted, a high breakdown voltage over the entire element can be easily achieved by making the breakdown voltage of the element edge portion (high voltage structure and the boundary region) higher than that of the element active portion. Even if low on-state resistance is achieved by increasing the average impurity concentration of the first parallel pn layer, the difference in the breakdown voltage between the element edge portion and the element active portion can be maintained.

The semiconductor device and the manufacturing method of the semiconductor device according to the present invention effect reduction of the on-state resistance and suppression of decreases in breakdown voltage.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A manufacturing method of a semiconductor device, comprising:
   repeatedly performing
      depositing a first-conductive-type semiconductor layer, and,
      forming, on a surface of the first-conductive-type semiconductor layer,
         a plurality of first first-conductive-type impurity implanting regions and a plurality of first second-conductive-type impurity implanting regions that are alternately arranged and repeated with a first pitch, and
         a plurality of second first-conductive-type impurity implanting regions and a plurality of second second-conductive-type impurity implanting regions that are alternately arranged and repeated with a second pitch narrower than the first pitch, at a position farther outward by a predetermined width than the first first-conductive-type impurity implanting regions and the first second-conductive-type impurity implanting regions;
   forming, through heat treating, a first parallel pn layer that includes a plurality of first first-conductive-type regions and a plurality of first second-conductive-type regions alternately arranged, by diffusion of the first first-conductive-type impurity implanting regions and the first second-conductive-type impurity implanting regions; and
   forming, through the heat treating, a second parallel pn layer that includes a plurality of second first-conductive-type regions and a plurality of second second-conductive-type regions alternately arranged, by diffusion of the second first-conductive-type impurity implanting regions and the second second-conductive-type impurity implanting regions, wherein
   the heat treating includes forming an intermediate region having
      a plurality of third first-conductive-type regions of an average impurity concentration that is lower than that of the first first-conductive-type regions,
      a plurality of third second-conductive-type region of an average impurity concentration that is lower than that of the first second-conductive-type regions,
      a plurality of fourth first-conductive-type regions of an average impurity concentration that is lower than that of the second first-conductive-type regions, and
      a plurality of fourth second-conductive-type regions with the average impurity concentration lower than that of the second second-conductive-type regions,
   between the first parallel pn layer and the second parallel pn layer, by diffusion of the first first-conductive-type impurity implanting regions, the first second-conductive-type impurity implanting regions, the second first-conductive-type impurity implanting regions, and the second second-conductive-type impurity implanting regions.

2. The manufacturing method of the semiconductor device according to claim 1, wherein
   the heat treating further comprises forming, in the intermediate region,
      a third parallel pn layer in which the third first-conductive-type regions and the third second-conductive-type regions are alternately arranged, and
      a fourth parallel pn layer in which the fourth first-conductive-type regions and the fourth second-conductive-type regions are alternately arranged.

3. The manufacturing method of the semiconductor device according to claim 1, wherein
   each of the first first-conductive-type regions and the first second-conductive-type regions is of a stripe shape and is arranged in a first direction, and
   each of the second first-conductive-type regions and the second second-conductive-type regions is of a stripe shape and is arranged in a second direction identical to the first direction.

4. The manufacturing method of the semiconductor device according to claim 1, wherein
   each of the first first-conductive-type regions and the first second-conductive-type regions is of a stripe shape and is arranged in a first direction, and
   each of the second first-conductive-type regions and the second second-conductive-type regions is of a stripe shape and is arranged in a second direction orthogonal to the first direction.

5. A manufacturing method of a semiconductor device, comprising:
   repeatedly performing
      depositing a first-conductive-type semiconductor layer, and
      forming, on a surface of the first-conductive-type semiconductor layer,
         a plurality of first second-conductive-type impurity implanting regions that are arranged with a first pitch,
         a plurality of second second-conductive-type impurity implanting regions that are arranged with a second pitch narrower than the first pitch, at a position farther outward by a predetermined width than the first second-conductive-type impurity implanting regions; and
   forming, through heat treating, a first parallel pn layer, in which a plurality of first second-conductive-type regions and the first-conductive-type semiconductor layer are alternately arranged, by diffusion of the first second-conductive-type impurity implanting regions; and
   forming, through the heat treating, a second parallel pn layer, in which a plurality of second second-conductive-type regions and the first-conductive-type semiconductor layer are alternately arranged, by diffusion of the second second-conductive-type impurity implanting regions, wherein the heat treating includes forming an intermediate region having a plurality of third second-conductive-type regions of an average impurity concentration that is lower than that of the first second-conductive-type regions, and a plurality of fourth second-conductive-type regions of an average impurity concentration that is lower than that of the second second-conductive-type regions, between the first parallel pn layer and the second parallel pn layer, by diffusion of the first second-conductive-type impurity implanting regions and the second second-conductive-type impurity implanting regions.

6. The manufacturing method of the semiconductor device according to claim 5, wherein each of the first second-conductive-type impurity implanting regions is of a stripe shape and is arranged in a first direction, and each of the second second-conductive-type impurity implanting regions is of a strip shape and is arranged in a second direction identical to the first direction.

7. The manufacturing method of the semiconductor device according to claim 5, wherein each of the first second-conductive-type impurity implanting regions is of a stripe shape and is arranged in a first direction, and each of the second second-conductive-type impurity implanting regions is of a strip shape and is arranged in a second direction orthogonal to the first direction.

8. The manufacturing method of the semiconductor device according to claim 1, wherein the predetermined width is no more than a half of a thickness of the first-conductive-type semiconductor layer deposited by one execution of the depositing of the first-conductive-type semiconductor.

9. The manufacturing method of the semiconductor device according to claim 1, further comprising:

forming the first parallel pn layer and the second parallel pn layer on a low resistance layer that has a resistance lower than that of the first-conductive-type semiconductor layer; and forming a surface element structure on the first parallel pn layer, the surface element structure and the low resistance layer being on different sides of the first parallel pn layer.

10. The manufacturing method of the semiconductor device according to claim 1, further comprising:

forming the first parallel pn layer in an element active portion of the semiconductor device in which current flows during an on-state of the semiconductor device; and forming the second parallel pn layer in an element edge portion of the semiconductor device surrounding the element active portion.

* * * * *